(12) United States Patent
Ichijo

(10) Patent No.: US 8,143,691 B2
(45) Date of Patent: Mar. 27, 2012

(54) SEMICONDUCTOR DEVICE AND METHOD FOR MAKING THE SAME

(75) Inventor: Hisao Ichijo, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 102 days.

(21) Appl. No.: 12/585,273

(22) Filed: Sep. 10, 2009

(65) Prior Publication Data
US 2010/0065909 A1    Mar. 18, 2010

(30) Foreign Application Priority Data

Sep. 17, 2008   (JP) .................................. 2008-238474

(51) Int. Cl.
 H01L 23/58   (2006.01)
(52) U.S. Cl. ........................................ 257/492; 257/493
(58) Field of Classification Search .................. 257/492, 257/493
See application file for complete search history.

(56) References Cited

U.S. PATENT DOCUMENTS

| | | | |
|---|---|---|---|
| 5,040,045 A | | 8/1991 | McArthur et al. |
| 5,374,843 A * | 12/1994 | Williams et al. ............. 257/492 |
| 5,386,136 A * | 1/1995 | Williams et al. ............. 257/409 |
| 5,514,608 A | 5/1996 | Williams et al. |
| 6,777,749 B2 * | 8/2004 | Rumennik et al. ............ 257/343 |
| 6,888,210 B2 * | 5/2005 | Jeon et al. ...................... 257/492 |
| 6,933,560 B2 * | 8/2005 | Lee et al. ....................... 257/328 |
| 6,979,875 B2 * | 12/2005 | Kwon et al. .................... 257/492 |
| 7,851,314 B2 * | 12/2010 | Mallikarjunaswamy et al. ............................. 438/286 |
| 2007/0034985 A1 | 2/2007 | Matsudai et al. |
| 2009/0065862 A1 | 3/2009 | Matsudai et al. |

FOREIGN PATENT DOCUMENTS

| | | |
|---|---|---|
| JP | 4-229658 | 8/1992 |
| JP | 07-050413 | 2/1995 |
| JP | 11-354779 | 12/1999 |
| JP | 2007-049039 | 2/2007 |
| JP | 2007-088334 | 4/2007 |

* cited by examiner

*Primary Examiner* — Eugene Lee
(74) *Attorney, Agent, or Firm* — Harness, Dickey & Pierce, P.L.C.

(57) ABSTRACT

To provide a semiconductor device and a method of making the same, the device being capable of preventing decrease in the withstanding voltage along the direction perpendicular to the source-drain direction and thereby improving the resistance to an overvoltage (overcurrent), the device includes: a p-type semiconductor substrate 201; an n-type diffusion region 202; a p-type body region 206, a p-type buried diffusion region 204, and an n-type drift region 207 within the n-type diffusion region 202; an n-type source region 208 and a p-type body contact region 209 within the p-type body region 206; an n-type drain region 210 within the n-type drift region 207; a gate insulating film above the p-type body region 206; and a gate electrode 211 above the gate insulating film, where the region 204 extends away from the region 206 farther than the farther edge of the gate electrode 211 is along a cross section perpendicular to the source-drain direction.

4 Claims, 20 Drawing Sheets

(L1-L2 CROSS SECTION)

(L1-L2 CROSS SECTION)

(W1-W2 CROSS SECTION)

(W1-W2 CROSS SECTION)

(W1-W2 CROSS SECTION)

(W1-W2 CROSS SECTION)

(W1-W2 CROSS SECTION)

(L1-L2 CROSS SECTION)

(L1-L2 CROSS SECTION)

(W1-W2 CROSS SECTION)

FIG. 13 (a)
(L1-L2 CROSS SECTION)    (W1-W2 CROSS SECTION)
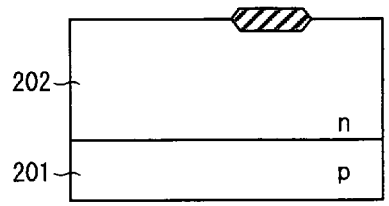 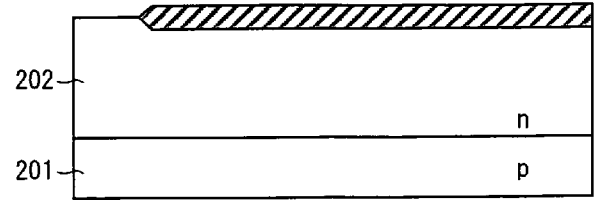
FIG. 13 (b)
(L1-L2 CROSS SECTION)    (W1-W2 CROSS SECTION)
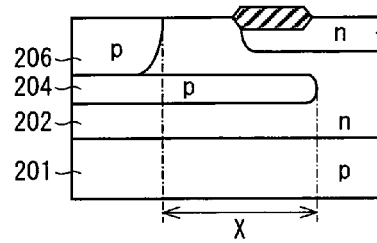 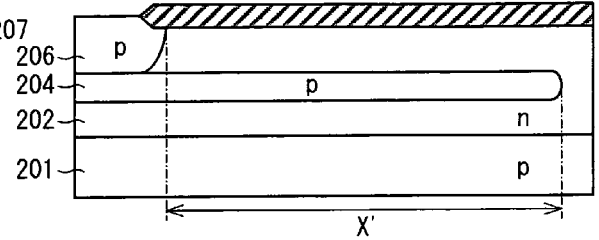
FIG. 13 (c)
(L1-L2 CROSS SECTION)    (W1-W2 CROSS SECTION)
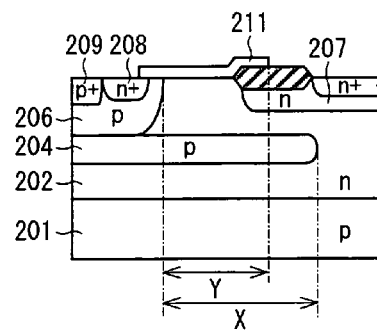 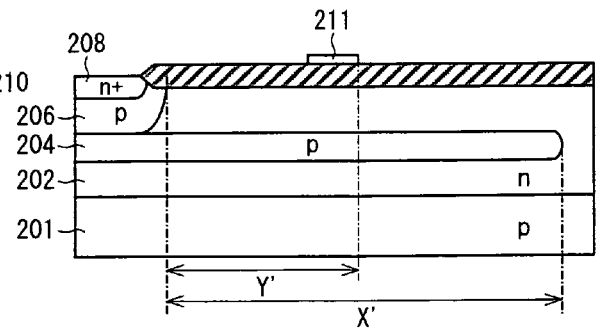

SEMICONDUCTOR DEVICE AND METHOD FOR MAKING THE SAME

This Nonprovisional application claims priority under 35 U.S.C. §119(a) on Patent Application No. 2008-238474 filed in Japan on Sep. 17, 2008, the entire contents of which are hereby incorporated by reference.

TECHNICAL FIELD

The present invention relates to a semiconductor device and a method for making the same and, in particular, to an LDMOS transistor and a method for making the same.

BACKGROUND ART

LDMOS transistors (lateral double-diffused MOS transistors) have a high switching speed. Furthermore, the LDMOS transistors are easy to use because they are voltage-driven. Because of such features, LDMOS transistors have been used in such devices as switching regulators, various drivers, and DC-DC converters. LDMOS transistors are widely used as a key device in fields of power devices and high-breakdown-voltage devices.

In general, performance of an LDMOS transistor is expressed in terms of (i) its withstanding voltage (breakdown voltage) observed in the off-state and (ii) its on-resistance. However, since there is normally a trade-off between them, it is difficult to achieve a high withstanding voltage and a low on-resistance at the same time. In view of this, research has been conducted for many years on how to achieve them at the same time.

FIGS. 15, 16 (a), 16 (b) and 17 illustrate a conventional LDMOS transistor (see, for example, Patent Literature 1). FIG. 15 is a schematic plan view of the n-channel LDMOS transistor formed on a p-type semiconductor substrate. FIGS. 16 (a) and 16 (b) are each a schematic cross-sectional view taken along line L1-L2 of FIG. 15 (a length direction of the channel of the LDMOS transistor, i.e., a source-drain direction; hereinafter referred to also as an L direction). FIG. 17 is a schematic cross-sectional view taken along line W1-W2 of FIG. 15 (a width direction of the channel of the LDMOS transistor, i.e., a direction perpendicular to the source-drain direction; hereinafter referred to also as a W direction).

As illustrated in FIG. 16 (a), the n-channel LDMOS transistor includes: a p-type semiconductor substrate 1; a p-type epitaxial layer 2 disposed on the p-type semiconductor substrate 1; and a p-type buried diffusion region 4 disposed along the interface between the p-type semiconductor substrate 1 and the p-type epitaxial layer 2.

The n-channel LDMOS transistor further includes within the p-type epitaxial layer 2: a p-type body region 6; a p-type diffusion region 4a formed so as to electrically connect the p-type body region 6 and the p-type buried diffusion region 4 to each other in a suitable manner; and an n-type drift region 7 formed separately from the p-type body region 6 along a planar direction.

The n-channel LDMOS transistor also includes an n-type source region 8 and a p-type body contact region 9 within the p-type body region 6, and further includes an n-type drain region 10 within the n-type drift region 7. The n-channel LDMOS transistor further includes a gate electrode 11 above the p-type body region 6 with a gate insulating film interposed between them.

The n-channel LDMOS transistor also includes a source contact 8b and a source electrode 8a formed on the n-type source region 8 and the p-type body contact region 9. The source electrode 8a electrically connects the n-type source region 8 and the p-type body region 6 with each other so that the n-type source region 8 and the p-type body region 6 have a same potential. The n-channel LDMOS transistor further includes a drain contact 10b and a drain electrode 10a formed on the n-type drain region 10 and also includes a gate plate 12 between the source electrode 8a and the drain electrode 10a.

Generally, in measuring the withstanding voltage of the n-channel LDMOS transistor in an off-state, the source electrode 8a and the gate electrode 11 are set to a GND potential, while the drain electrode 10a is provided with a positive potential. In this state, application of a reverse bias between the drain and the source causes an electric field within a depletion layer to reach its critical electric field strength at a certain voltage. This causes an avalanche breakdown, which results in a large amount of current flowing between the drain and the source. The above certain voltage applied is referred to as a withstanding voltage of the transistor.

Application of a reverse bias between the drain and the source along the L direction of the LDMOS transistor generally causes concentration of an electric field at a gate edge on a drain side (indicated as A in FIG. 16 (a)). This lowers the withstanding voltage.

Therefore, relaxing the electric field at the gate edge is an important factor to have a higher withstanding voltage. In addition, such concentration of an electric field near the gate edge may cause some electric charge to be left in the gate insulating film. This gives rise to a reliability problem. Thus, relaxing the electric field at the gate edge is important also for improvement of reliability of the transistor.

FIG. 16 (b) partially illustrates equipotential lines (indicated by dashed lines) of a potential along the L direction, which equipotential lines are obtained when the source electrode 8a and the gate electrode 11 of the LDMOS transistor are set to the GND potential and a positive potential is applied on the drain electrode 10a.

Application of a reverse bias between the drain and the source causes a depletion layer to extend from the p-type body region 6. As illustrated in FIG. 16 (b), the presence of the p-type buried diffusion region 4 and the gate plate 12 facilitates shifting the depletion layer toward the drain electrode 10a for relaxation of the surface electric field. As a result, the electric field at the gate edge on the drain side (indicated as A in FIG. 16 (b)) is relaxed. This attains a withstanding voltage, and also attains a better trade-off between the withstanding voltage and the on-resistance. In these respects, this technique is effective.

FIGS. 18, 19 (a), 19 (b), 20 (a), and 20 (b) illustrate another conventional LDMOS transistor (see, for example, Patent Literature 2). FIG. 18 is a schematic plan view of the n-channel LDMOS transistor formed on a p-type semiconductor substrate. FIGS. 19 (a) and 19 (b) are each a schematic cross-sectional view taken along line L1-L2 of FIG. 18. FIGS. 20 (a) and 20 (b) are each a schematic cross-sectional view taken along line W1-W2 of FIG. 18.

As illustrated in FIG. 19 (a), the LDMOS transistor includes: a p-type semiconductor substrate 101; an n-type epitaxial layer 102 disposed above the p-type semiconductor substrate 101; and an n-type high-density buried diffusion layer 103 disposed along an interface between the p-type semiconductor substrate 101 and the n-type epitaxial layer 102.

The n-type epitaxial layer 102 includes: a p-type buried diffusion region 104; an n-type diffusion region 105 formed adjacently to the p-type buried diffusion region 104; a p-type body region 106 formed in contact with the p-type buried diffusion region 104; and an n-type drift region 107 formed adjacently to the p-type body region 106.

The n-channel LDMOS transistor also includes an n-type source region 108 and a p-type body contact region 109 within the p-type body region 106, and further includes an n-type drain region 110 within the n-type drift region 107.

The n-channel LDMOS transistor further includes a gate electrode 111 above the p-type body region 106 with a gate insulating film interposed between them. The n-channel LDMOS transistor also includes a drain contact 110a and a drain electrode 110b above the n-type drain region 110, and further includes a source contact 108a and a source electrode 108b above the n-type source region 108 and the p-type body contact region 109. The source electrode 108b electrically connects the n-type source region 108 and the p-type body region 106 to each other at a same potential.

The LDMOS transistor is largely different from the above-described conventional LDMOS transistor (see, for example, Patent Literature 1) in that the p-type body region 106 formed within the n-type epitaxial layer 102 is electrically isolated from the p-type semiconductor substrate 101 in a suitable manner. According to the conventional LDMOS transistor disclosed in Patent Literature 1 (see FIGS. 15, 16 (a), 16 (b) and 17), the p-type body region 6 is electrically connected to the p-type semiconductor substrate 1 via the p-type diffusion region 4a and the p-type buried diffusion region 4 in a suitable manner. Since the p-type semiconductor substrate 1 is normally fixedly set to the GND potential, the p-type body region 6 and the n-type source region 8 are also fixedly set to the GND potential.

When multiple n-channel transistors are arranged in series between, for example, a power supply and GND in a circuit configuration, an n-channel transistor that is the first one from the power supply has a potential in the source region in an on-state, which potential is substantially fixed to the power supply voltage. Thus, the source region is required to have a withstanding voltage, which is voltage difference between the source region and the p-type semiconductor substrate (which is normally set to the GND potential), high enough for withstanding the power supply voltage.

When, as mentioned above, the source region is required to have a withstanding voltage high enough for withstanding the power supply voltage unlike the p-type semiconductor substrate (which is normally set to the GND potential), the conventional LDMOS transistor disclosed in Patent Literature 1 cannot be used since the source region is electrically connected to the p-type semiconductor substrate (which is normally set to the GND potential) and therefore fixedly set to the GND potential.

In contrast, according to the conventional LDMOS transistor disclosed in Patent Literature 2, the source region is electrically isolated from the p-type semiconductor substrate (which is set to the GND potential). This allows the LDMOS transistor to be used even when the source region is required to have a withstanding voltage high enough for withstanding the power supply voltage. Thus, the conventional LDMOS transistor disclosed in Patent Literature 2 has an advantage over the conventional LDMOS transistor disclosed in Patent Literature 1 in that the former has a wider application in circuit.

FIG. 19 (b) partially illustrates equipotential lines (indicated by dashed lines) of a potential along the L direction (direction L1-L2 of FIG. 18), which equipotential lines are obtained when a reverse bias is applied between the drain and the source of the conventional LDMOS transistor disclosed in Patent Literature 2. The p-type buried diffusion region 104 facilitates shifting a depletion layer toward a drain side. This sufficiently relaxes an electric field at a gate edge (indicated as A in FIG. 19 (b)) and thereby likely improves the withstanding voltage.

Citation List
  Patent Literature 1
    Japanese Patent Application Publication, Tokukaihei, No. 7-50413 A (Publication Date: Feb. 21, 1995)
  Patent Literature 2
    Patent No. U.S. Pat. No. 6,979,875B2 (Issuance Date: Dec. 27, 2005)

SUMMARY OF INVENTION

Technical Problem

However, the LDMOS transistor disclosed in Patent Literature 2 poses a problem described below when the gate wire is laid as in the LDMOS transistor disclosed in Patent Literature 1.

FIG. 20 (a) is a schematic cross-sectional view taken along a W direction (W1-W2 of FIG. 18). As illustrated in FIG. 20 (a), according to a cross-sectional structure along the W direction, the gate electrode 111 is laterally distanced away from the p-type body region 106 farther than the p-type buried diffusion region 104 is, unlike in a cross-sectional structure along an L direction (L1-L2 of FIG. 18). Application of a reverse bias between the drain and the source in this state, as illustrated in FIG. 20 (b), causes a potential distribution in which an electric field is concentrated at a bottom of the p-type buried diffusion region 104 (indicated as B in FIG. 20 (b)), unlike in the cross-sectional structure along the L direction.

Because the gate electrode 111 is positioned away from the p-type body region in the lateral direction farther than the p-type buried diffusion region 104 is, an effect of relaxing an electric field by the p-type buried diffusion region 104 is reduced. This causes a withstanding voltage along the W direction to be lower than a withstanding voltage along the L direction. As a result, the withstanding voltage of the LDMOS transistor is problematically decreased.

Furthermore, when the withstanding voltage along the W direction is lower than the withstanding voltage along the L direction, a large channel width W cannot be utilized effectively and surge tolerance is poor in the LDMOS transistor because an avalanche breakdown will occur dominantly in the W direction when overvoltage or overcurrent such as a surge is applied to the drain region.

In general, application of an overvoltage (overcurrent) such as a surge to the drain region of the LDMOS transistor first intensifies an electric field and thereby causes an avalanche breakdown near the drain region. Holes thereby caused near the drain region flow into the p-type body region, thereby causing a potential difference. The potential difference turns on a parasitic bipolar transistor formed with the n-type drain region, the p-type body region, and the n-type source region. This causes a large amount of current to flow from the drain region into the source region. This eventually thermally destructs the LDMOS transistor.

In general, in order to improve resistance to an overvoltage (overcurrent) such as a surge, it is important to cause an avalanche breakdown uniformly in the entire LDMOS transistor. In particular, while arranging a large number of LDMOS transistors in an array allows a large channel width W to be formed by such transistors, it is important to effectively use such a large channel width W by setting the withstanding voltage along the W direction higher than the withstanding voltage along the L direction so that the occurrence of an avalanche breakdown is controllable by means of the withstanding voltage along the L direction.

The present invention has been accomplished so as to solve the above problems. It is an object of the present invention to provide a semiconductor device such as an LDMOS transistor and a method of making the same, in which semiconductor device a decrease in a withstanding voltage is prevented along a W direction for improvement in a trade-off between on-resistance and a withstanding voltage and also in resistance to an overvoltage (overcurrent) such as a surge.

Solution to Problem

In order to attain the above object, a semiconductor device of the present invention includes: a semiconductor substrate of a first conductive type; a conductive region of a second conductive type above the semiconductor substrate; a body region of the first conductive type within the conductive region of the second conductive type; a buried diffusion region of the first conductive type within the conductive region of the second conductive type, the buried diffusion region being provided between the semiconductor substrate and the body region and in contact with the body region; a source region of the second conductive type and a body contact region of the first conductive type within the body region; a drift region of the second conductive type within the conductive region of the second conductive type, the drift region of the second conductive type being provided separately from the body region; a drain region of the second conductive type within the drift region; a gate insulating film above the body region; and a gate electrode above the gate insulating film, the buried diffusion region of the first conductive type extending away from the body region farther than the gate electrode is, along a cross section perpendicular to a source-drain direction.

According to the conventional art disclosed in, e.g., Patent Literature 2, a gate electrode extends away from the body region farther than the first-conductive-type buried diffusion region along a cross section perpendicular to a source-drain direction. In contrast, according to the semiconductor device of the present invention having the above arrangement, the buried diffusion region of the first conductive type extends away from the body region farther than the gate electrode is along a cross section perpendicular to the source-drain direction. This remarkably relaxes concentration of an electric field at a bottom of the first-conductive-type buried diffusion region and also significantly improves a withstanding voltage of the semiconductor device.

Another semiconductor device of the present invention includes: a semiconductor substrate of a first conductive type; a conductive region of a second conductive type above the semiconductor substrate; a body region of the first conductive type within the conductive region of the second conductive type; a buried diffusion region of the first conductive type within the conductive region of the second conductive type, the buried diffusion region of the first conductive type being provided between the semiconductor substrate and the body region and in contact with the body region; a source region of the second conductive type and a body contact region of the first conductive type within the body region; a metal wire above the source region, the metal wire being electrically connected with a source electrode of the source region; a drift region of the second conductive type within the conductive region of the second conductive type, the drift region of the second conductive type being provided separately from the body region; a drain region of the second conductive type within the drift region; a gate insulating film above the body region; and a gate electrode above the gate insulating film, the buried diffusion region of the first conductive type extending away from the body region farther than the metal wire is, along a cross section perpendicular to a source-drain direction.

According to the semiconductor device of the present invention having the above arrangement, the buried diffusion region of the first conductive type extends away from the body region farther than the metal wire is along a cross section perpendicular to the source-drain direction. This remarkably relaxes concentration of an electric field at a bottom of the buried diffusion region and also significantly improves a withstanding voltage of the semiconductor device.

A method of the present invention for making a semiconductor device includes: providing a semiconductor substrate of a first conductive type; forming a conductive region of a second conductive type above the semiconductor substrate; forming a body region of the first conductive type within the conductive region of the second conductive type; forming a buried diffusion region of the first conductive type within the conductive region of the second conductive type, the buried diffusion region of the first conductive type being provided between the semiconductor substrate and the body region and in contact with the body region; forming a source region of the second conductive type and a body contact region of the first conductive type within the body region; forming a drift region of the second conductive type within the conductive region of the second conductive type, the drift region of the second conductive type being provided separately from the body region; forming a drain region of the second conductive type within the drift region; forming a gate insulating film above the body region; and forming a gate electrode above the gate insulating film, wherein the buried diffusion region of the first conductive type is formed so as to extend away from the body region farther than the gate electrode along a cross section perpendicular to a source-drain direction.

According to the conventional art disclosed in, e.g., Patent Literature 2, the buried diffusion region of the first conductive type extends away from the body region farther than the gate electrode is along a cross section perpendicular to the source-drain direction. In contrast, according to the method of the present invention for making a semiconductor device, the buried diffusion region of the first conductive type extends away from the body region farther than the gate electrode is along a cross section perpendicular to the source-drain direction. This remarkably relaxes concentration of an electric field at a bottom of the buried diffusion region and also significantly improves a withstanding voltage of the semiconductor device.

Another method of the present invention for making a semiconductor device includes: providing a semiconductor substrate of a first conductive type; forming a conductive region of a second conductive type above the semiconductor substrate; forming a body region of the first conductive type within the conductive region of the second conductive type; forming a buried diffusion region of the first conductive type within the conductive region of the second conductive type, the buried diffusion region of the first conductive type being provided between the semiconductor substrate and the body region and in contact with the body region; forming a source region of the second conductive type and a body contact region of the first conductive type within the body region; forming a drift region of the second conductive type within the conductive region of the second conductive type, the drift region of the second conductive type being provided separately from the body region; forming a drain region of the second conductive type within the drift region; forming a gate insulating film above the body region; forming a gate electrode above the gate insulating film; and forming a metal wire above the source region, the metal wire being electrically connected with a source electrode of the source region, wherein the buried diffusion region of the first conductive type is formed so as to extend away from the body region farther than the metal wire along a cross section perpendicular to a source-drain direction.

According to the method of the present invention for making a semiconductor device, the buried diffusion region of the first conductive type extends away from the body region farther than the metal wire is along a cross section perpendicular to the source-drain direction. This remarkably relaxes concentration of an electric field at a bottom of the buried diffusion region and also significantly improves a withstanding voltage of the semiconductor device.

Advantageous Effects of Invention

The present invention can prevent a decrease in a withstanding voltage along a channel width direction in semiconductor devices such as LDMOS transistors, and thereby improves the semiconductor devices in terms of a trade-off between on-resistance and a withstanding voltage and also in terms of resistance to an overvoltage (overcurrent) such as a surge.

BRIEF DESCRIPTION OF DRAWINGS

FIG. 2 (b) is a cross-sectional view of the n-channel LDMOS transistor of FIG. 1 for explanation of a potential distribution along an L direction, observed when an source electrode and an gate electrode are set to a GND potential, while a drain electrode is provided with a positive potential.

FIG. 3 (b) is a cross-sectional view illustrating a potential distribution along the W direction in connection with FIG. 3 (a), which potential distribution is observed when X' is 0 µm, for example.

FIG. 3 (c) is a cross-sectional view illustrating a potential distribution along the W direction in connection with FIG. 3 (a), which potential distribution is observed when X' is 16 µm, for example.

FIG. 4 (b) is a cross-sectional view illustrating a potential distribution along the W direction in connection with FIG. 4 (a), which potential distribution is observed when Y' is 1 µm, for example.

FIG. 4 (c) is a cross-sectional view illustrating a potential distribution along the W direction in connection with FIG. 4 (a), which potential distribution is observed when Y' is 20 µm, for example.

FIG. 5 (b) is a cross-sectional view of the n-channel LDMOS transistor of FIG. 1 for explanation of a potential distribution along the W direction, observed when the source electrode and the gate electrode are set to the GND potential, while the drain electrode is provided with a positive potential.

FIG. 7 (b) is a graph concerning the LDMOS transistor of FIG. 6, which graph illustrates dependence of a withstanding voltage along the W direction upon (X'-Y').

FIG. 9 (b) is a cross-sectional view of the n-channel LDMOS transistor of FIG. 8 for explanation of a potential distribution along an L direction, observed when a source electrode and a gate electrode are set to a GND potential, while a drain electrode is provided with a positive potential.

FIG. 10 (b) is a cross-sectional view of the n-channel LDMOS transistor of FIG. 8 for explanation of a potential distribution along a W direction, observed when the source electrode and the gate electrode are set to the GND potential, while the drain electrode is provided with a positive potential.

FIG. 12 (b) is a graph illustrating dependence of a withstanding voltage along a W direction upon (X'-Y'), in the LDMOS transistor of FIG. 11.

FIG. 13 (a) is a cross-sectional view illustrating, as a fifth embodiment of the present invention, a step of making the n-channel LDMOS transistor according to the first or second embodiment.

FIG. 13 (b) is a cross-sectional view illustrating, as the fifth embodiment of the present invention, a step of manufacturing the n-channel LDMOS transistor according to the first or second embodiment.

FIG. 13 (c) is a cross-sectional view illustrating, as the fifth embodiment of the present invention, a step of manufacturing the n-channel LDMOS transistor according to the first or second embodiment.

FIG. 14 (b) is a cross-sectional view illustrating, as the sixth embodiment of the present invention, a step of manufacturing the n-channel LDMOS transistor according to the third or fourth embodiment.

FIG. 14 (c) is a cross-sectional view illustrating, as the sixth embodiment of the present invention, a step of manufacturing the n-channel LDMOS transistor according to the third or fourth embodiment.

FIG. 14 (d) is a cross-sectional view illustrating, as the sixth embodiment of the present invention, a step of manufacturing the n-channel LDMOS transistor according to the third or fourth embodiment.

FIG. 16 (*b*) is a cross-sectional view of the n-channel LDMOS transistor of FIG. 15 for explanation of a potential distribution along the L direction, observed when a source electrode and a gate electrode are set to a GND potential, while a drain electrode is provided with a positive potential.

FIG. 19 (*b*) is a cross-sectional view of the n-channel LDMOS transistor of FIG. 18 for explanation of a potential distribution along an L direction, observed when a source electrode and a gate electrode are set to a GND potential, while a drain electrode is provided with a positive potential.

FIG. 20 (*b*) is a cross-sectional view of the n-channel LDMOS transistor of FIG. 18 for explanation of a potential distribution along a W direction, observed when the source electrode and the gate electrode are set to the GND potential, while the drain electrode is provided with a positive potential.

DESCRIPTION OF EMBODIMENTS

The following describes semiconductor devices according to embodiments of the present invention with reference to the attached drawings.

First Embodiment

Figure 1:
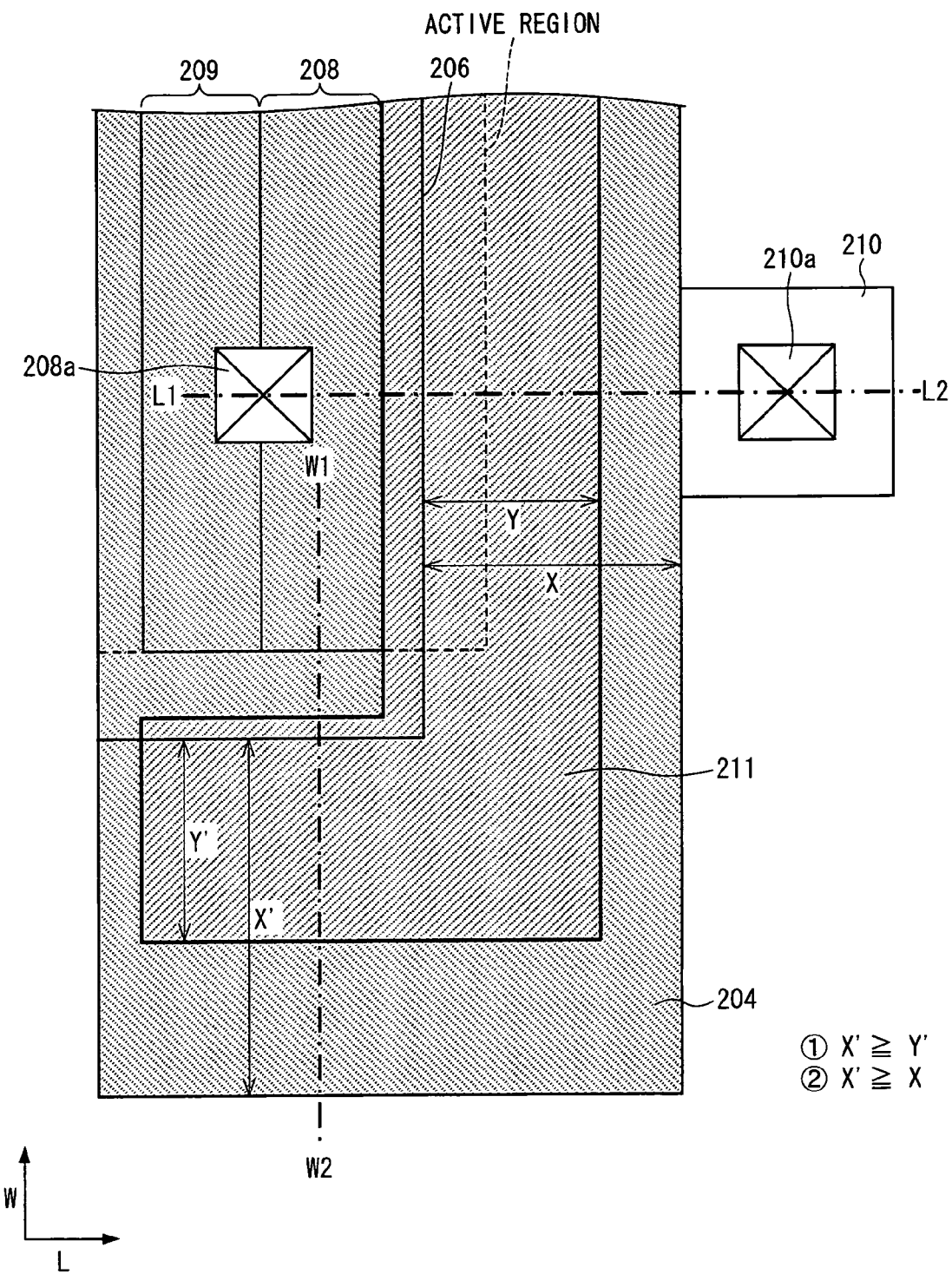
FIG. 1 is a plan view of an n-channel LDMOS transistor in accordance with a first embodiment of the present invention.
Figure 2:
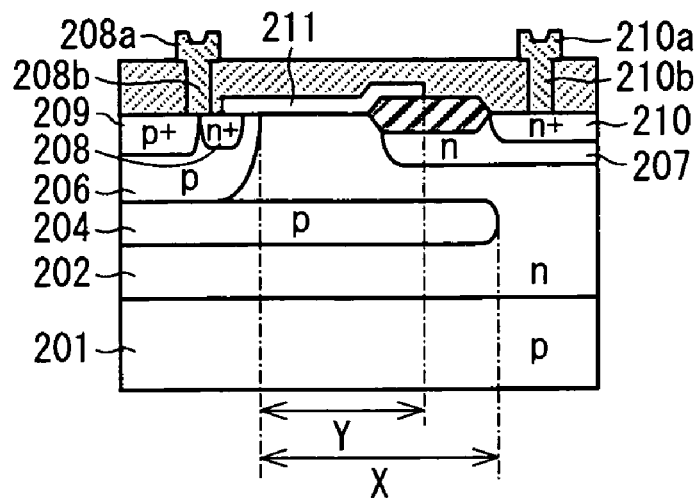
FIG. 2 (a) is a schematic cross-sectional view taken along L1-L2 of FIG. 1.
Figure 2:
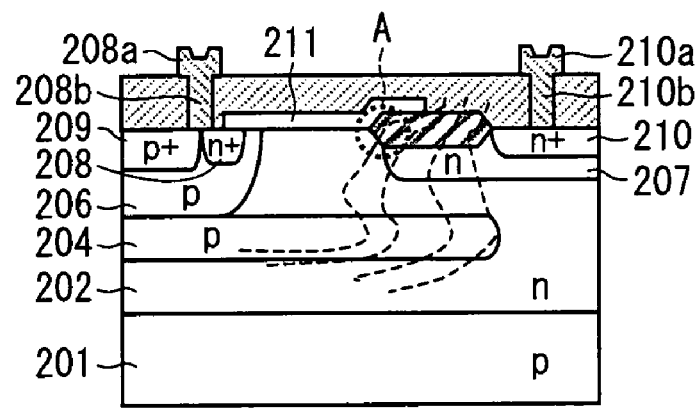
Figure 5:
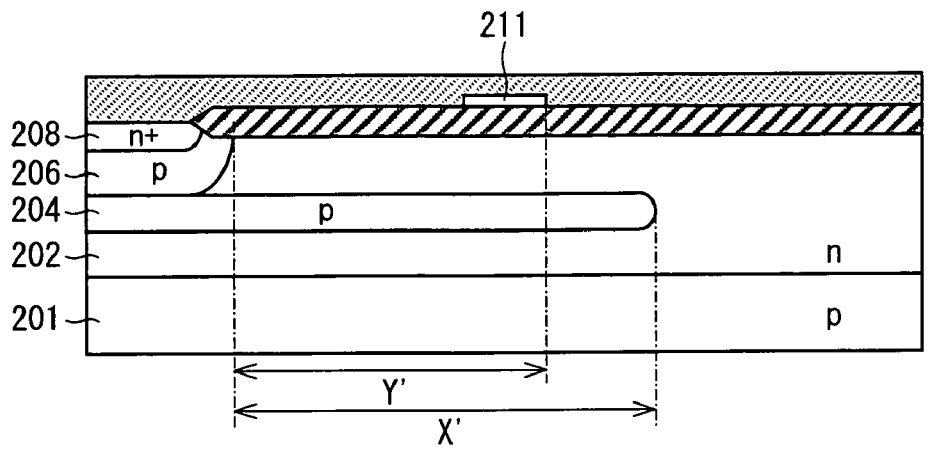
FIG. 5 (a) is a schematic cross-sectional view taken along W1-W2 of FIG. 1.
Figure 5:
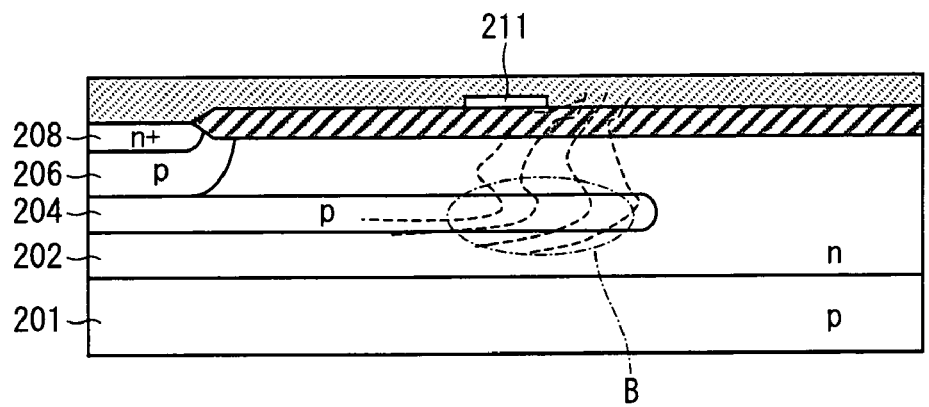

FIG. 1 is a plan view of an n-channel LDMOS transistor according to a first embodiment. FIGS. 2 (*a*) and (*b*) are each a schematic cross-sectional view taken along an L direction (i.e., direction L1-L2 of FIG. 1). FIGS. 5 (*a*) and 5 (*b*) are each a schematic cross-sectional view taken along a W direction (i.e., direction W1-W2 of FIG. 1).

As illustrated in FIG. 2 (*a*), the n-channel LDMOS transistor of the present embodiment includes: a p-type semiconductor substrate 201; and an n-type diffusion region 202 disposed on the p-type semiconductor substrate 201. The n-channel LDMOS transistor further includes within the n-type diffusion region 202: a p-type buried diffusion region 204 provided to relax a surface electric field; a p-type body region 206; and an n-type drift region 207 disposed separately from the p-type body region 206 along a planar direction.

The n-type diffusion region 202 may be replaced by an epitaxial layer.

The n-channel LDMOS transistor includes an n-type source region 208 and a p-type body contact region 209 within the p-type body region 206, and also includes an n-type drain region 210 within the n-type drift region 207. The n-channel LDMOS transistor further includes a gate electrode 211 above the p-type body region 206 with a gate insulating film interposed between them.

The n-channel LDMOS transistor further includes a drain contact 210*b* and a drain electrode 210*a* above the n-type drain region 210, and also includes a source contact 208*b* and a source electrode 208*a* above the n-type source region 208 and the p-type body contact region 209. The source electrode 208*a* electrically connect the n-type source region 208 and the p-type body region 206 to each other at a same potential.

The p-type buried diffusion region 204 within the n-type diffusion region 202 is so disposed between the semiconductor substrate 201 and the body region 206 as to be in contact with the body region 206.

Among the above members, respective densities of the p-type body region 206, the n-type drift region 207, and the p-type buried diffusion region 204 are lower than densities of the p-type body contact region 209 and the drain contact 210*b* and higher than a density of the n-type diffusion region 202.

As illustrated in FIG. 5 (*a*), the n-channel LDMOS transistor of the present invention is configured such that the p-type buried diffusion region 204 provided to relax the surface electric field extends along the W direction (i.e., lateral direction in FIG. 5 (*a*)) away from the p-type body region 206 as far as or farther than the gate electrode 211 is (X'≧Y'). This arrangement significantly relaxes electric field concentration at a bottom of the p-type buried diffusion region 204 and thereby improves a withstanding voltage along the W direction.

The following describes in detail with how the above arrangement of the present invention prevents or alleviates a decrease in the withstanding voltage along the W direction, i.e., a problem with conventional art.

Figure 3:
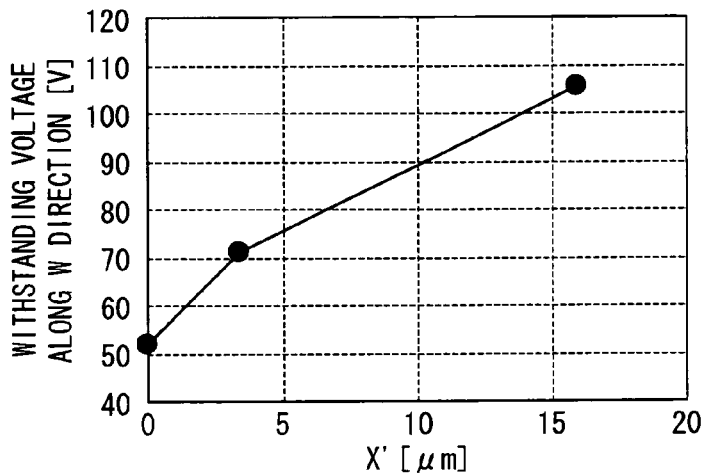
FIG. 3 (a) is a graph illustrating dependence of a withstanding voltage along a W direction upon a distance X' in which a p-type buried diffusion region extends away from a p-type body region, in the LDMOS transistor of FIG. 1.
Figure 3:
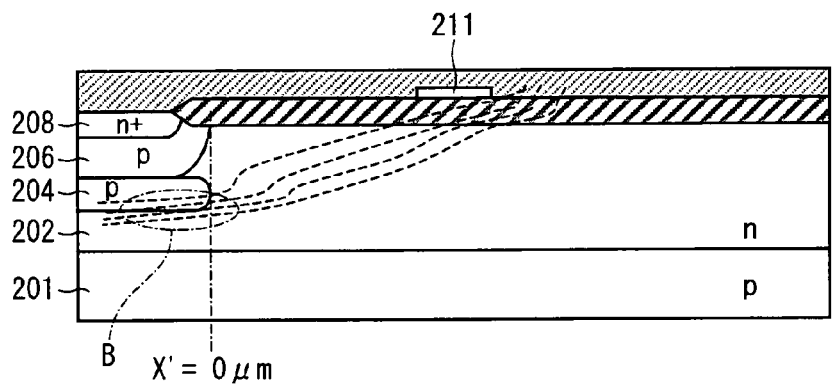
Figure 3:
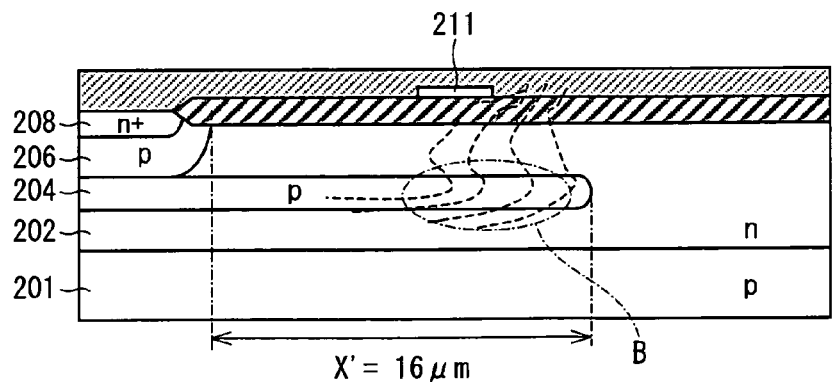

Described first with reference to the drawings is an effect of relaxing an electric field with respect to the W direction by the p-type buried diffusion region 204. FIG. 3 (*a*) shows dependence of the withstanding voltage along the W direction upon a distance X' which the p-type buried diffusion region 204 extends away from the p-type body region 206. FIG. 3 (*b*) shows a potential distribution observed when the distance X' which the p-type buried diffusion region 204 extends away from the p-type body region 206 is 0 μm. FIG. 3 (*c*) shows a potential distribution observed when the distance X' is 16 μm for example.

As illustrated in FIG. 3 (*a*), an increase in the distance X' which the p-type buried diffusion region 204 extends away from the p-type body region 206 increases the withstanding voltage along the W direction. This is due to the following: For example, when X' is 0 μm, a potential is concentrated at the bottom of the p-type buried diffusion region 204 (indicated as B in FIG. 3 (*b*)), whereby a withstanding voltage is decreased. In contrast, when, as illustrated in FIG. 3 (*c*), the p-type buried diffusion region 204 extends sufficiently away from the p-type body region 206 (X'=16 μm) sufficiently, the electric field is relaxed at the bottom of the p-type buried diffusion region 204, whereby the withstanding voltage is significantly increased.

Figure 4:
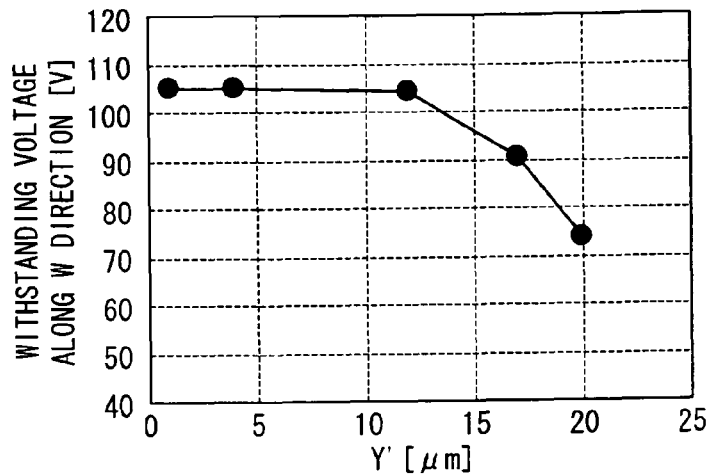
FIG. 4 (a) is a graph illustrating dependence of the withstanding voltage along the W direction upon various distances Y' by which a farther edge of a gate electrode 211 is distanced away from the p-type body region, in the LDMOS transistor of FIG. 1.
Figure 4:
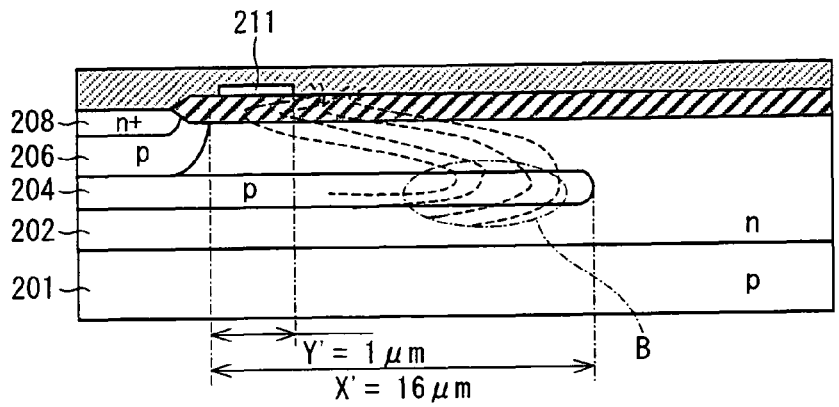
Figure 4:
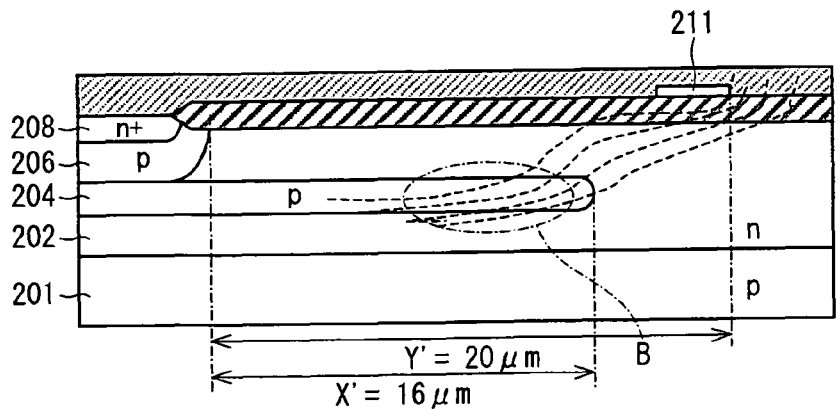

Described next with reference to the drawings is how the gate electrode 211 affects the withstanding voltage along the W direction. FIG. 4 (*a*) shows dependence of the withstanding voltage along the W direction upon various distances Y' by which a farther edge of the gate electrode 211 is distanced away from the p-type body region 206, which dependence is observed when the distance X' which the p-type buried diffusion region 204 extends away from the p-type body region 206 is fixed at 16 μm. As illustrated in FIG. 4 (*a*), an increase in the distance Y' beyond a vicinity of the distance X' (16 μm) significantly decreases the withstanding voltage along the W direction. This is due to the following: when the distance Y' is 1 μm for example, the electric field is sufficiently relaxed at the bottom of the p-type buried diffusion region 204 (see FIG. 4 (*b*)), as in the case described above. In contrast, when the gate electrode 211 is distanced away from the p-type body region 206 to such an extent as to satisfy Y'≧X' (e.g., Y'=20

μm), the effect of relaxing the electric field by the p-type buried diffusion region 204 is decreased (see FIG. 4 (c)).

Thus, according to the above arrangement of the present invention, the distance X' which the p-type buried diffusion region 204 extends away from the p-type body region 206 is larger than the distance X (shown in FIG. 2 (a)) which the p-type buried diffusion region 204 extends away from the p-type body region 206 along the L direction (i.e., lateral direction in FIG. 2 (a)). This relaxes the electric field at the bottom of the p-type buried diffusion region 204 (as indicated as B in FIG. 3 (b)), and thereby increases the withstanding voltage along the W direction.

Further, as illustrated in FIG. 2 (b) showing a potential distribution along the L direction (i.e., direction L1-L2 in FIG. 1), when a reverse bias is applied between a drain and a source, the n-channel LDMOS transistor of the present invention causes the p-type buried diffusion region 204 to sufficiently relax an electric field at a gate edge on a drain side (indicated as A in FIG. 2 (b)). This allows a given withstanding voltage to be attained with a higher density of the n-type drift region 207 and a lower on-resistance that results from the higher density of the n-type drift region 207. This consequently improves a trade-off between the withstanding voltage and the on-resistance.

The n-channel LDMOS transistor of the present invention is so designed that the distance X' which the p-type buried diffusion region 204 extends away from the p-type body region 206 is equal to or larger than a distance X along the L direction as shown in FIG. 2 (a) (X'≧X).

The above arrangement allows the withstanding voltage along the W direction to be set higher than the withstanding voltage along the L direction. Consequently, appropriate positional relationship of the p-type buried diffusion region 204 and the gate electrode 211 allows the withstanding voltage of the LDMOS transistor to be determined depending on the L direction and therefore prevents decrease in the withstanding voltage of the LDMOS transistor depending on the W direction.

As illustrated in FIG. 2 (b), the p-type buried diffusion region 204 sufficiently relaxes the electric field at the gate edge (indicated as A). Thus, as regards a withstanding voltage along the L direction, when a reverse bias is applied between the drain and the source, the density of the n-type drift region 207 may be set high so that the on-resistance is relatively reduced for a purpose of maintaining a same withstanding voltage.

The occurrence of an avalanche breakdown is controlled by means of the withstanding voltage along the L direction when an overvoltage (overcurrent) such as a surge is applied to the drain region 210. For example, if a large number of the LDMOS transistors are arranged in an array, this allows effective use of a large channel width W. This consequently improves surge resistance significantly.

The above arrangement of the present invention allows the LDMOS transistor to prevent decrease in the withstanding voltage along the W direction, improve the trade-off between the on-resistance and the withstanding voltage, and improve the resistance to an overvoltage (overcurrent) such as a surge.

Second Embodiment

Figure 6:
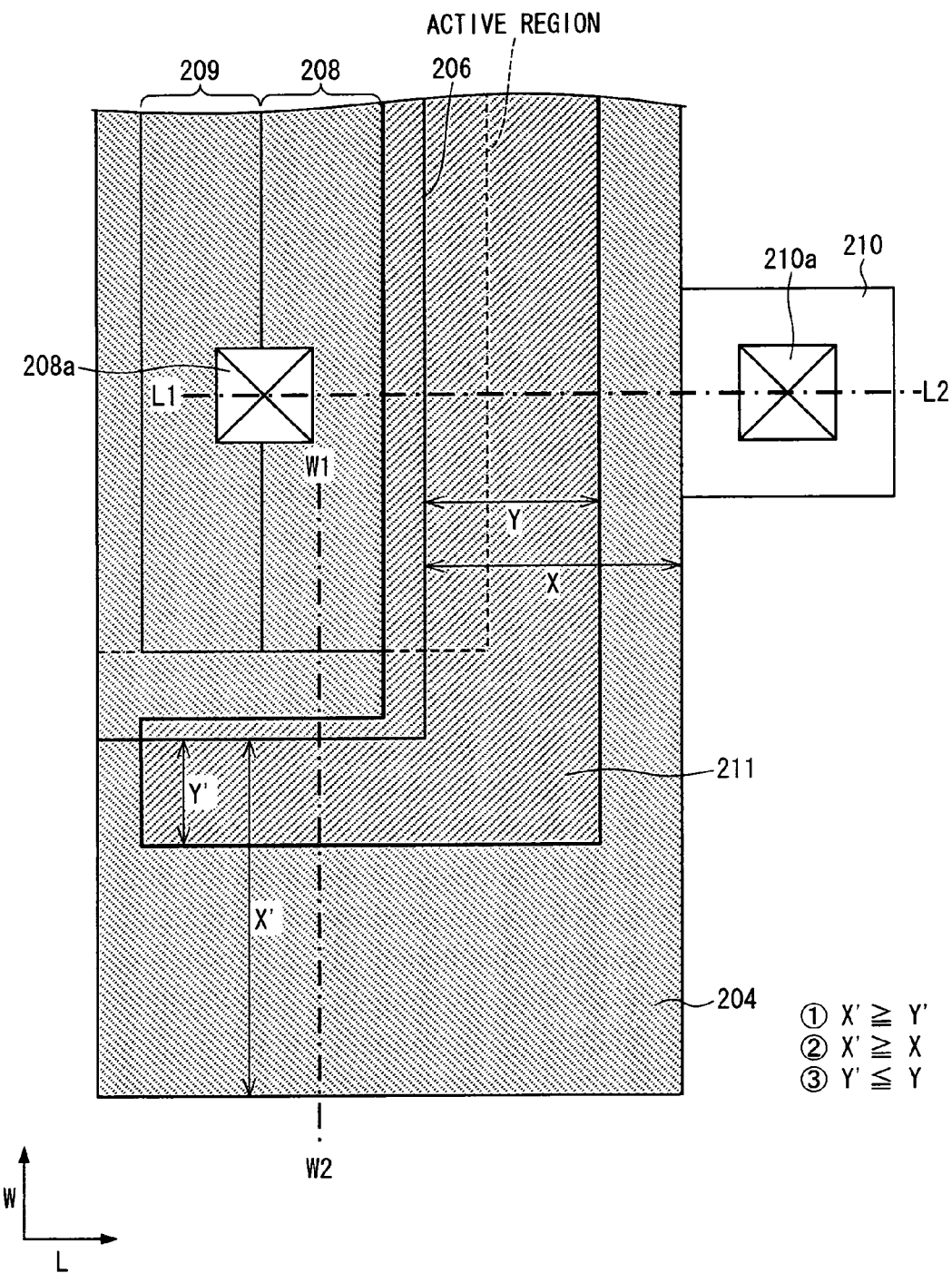
FIG. 6 is a plan view of an n-channel LDMOS transistor in accordance with a second embodiment of the present invention.
Figure 7:
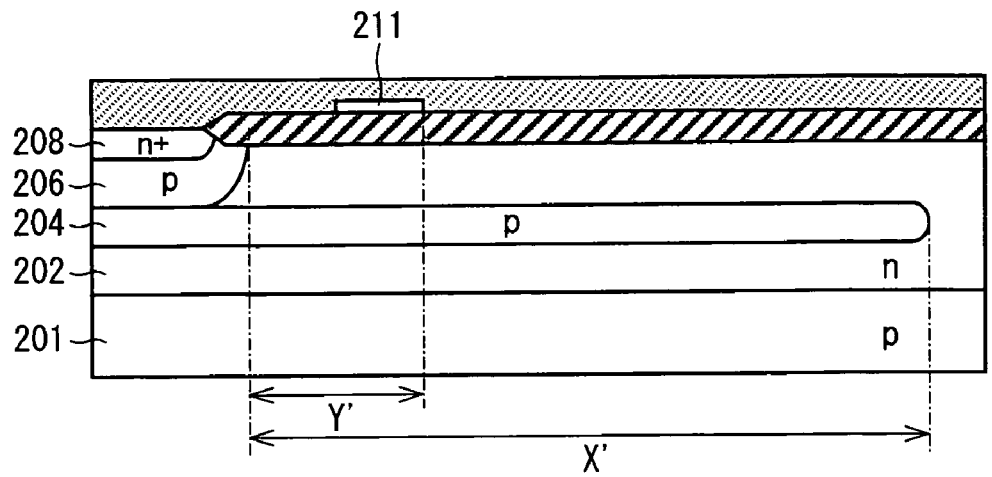
FIG. 7 (a) is a schematic cross-sectional view taken along W1-W2 of FIG. 6.
Figure 7:
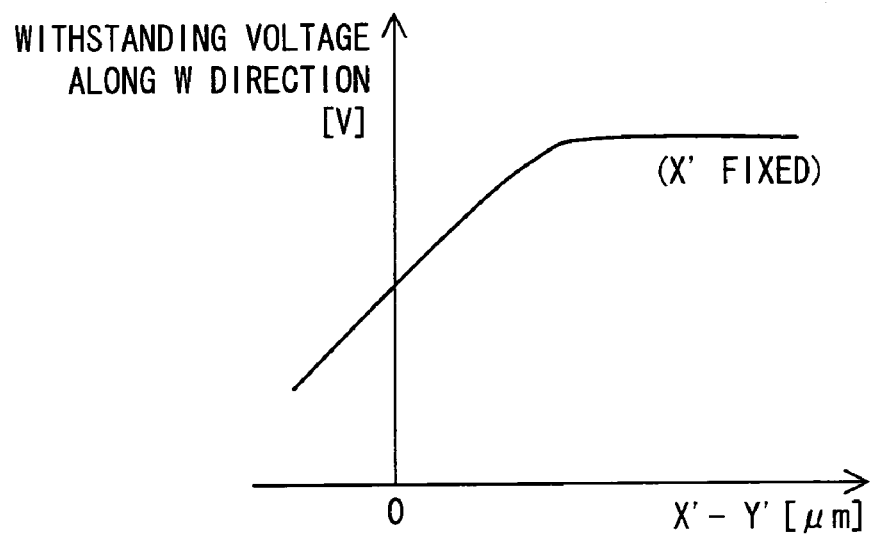

The following describes an n-channel LDMOS transistor according to a second embodiment with reference to the drawings. Identical elements are represented by same reference numerals between the previous embodiment and the present embodiment. Such elements are thus not described again in detail here. FIG. 6 is a plan view of the n-channel LDMOS transistor according to the second embodiment. FIG. 7 (a) is a schematic cross-sectional view taken along line W1-W2 of FIG. 6. A cross-sectional structure taken along line L1-L2 of FIG. 6 is identical to a cross-sectional structure of the n-channel LDMOS transistor according to the first embodiment (see FIG. 2(a)). FIG. 7 (b) shows dependence of a withstanding voltage of the n-channel LDMOS transistor upon (X'-Y').

As illustrated in FIGS. 6 and 7 (a), the n-channel LDMOS transistor of the present embodiment is different from the n-channel LDMOS transistor of the first embodiment shown in FIG. 1 in that a distance Y' by which a farther edge of the gate electrode 211 is distanced away from the p-type body region 206 along a W direction (i.e., direction W1-W2 of FIG. 6) is smaller than a distance Y (shown in FIG. 6) by which a farther edge of the gate electrode 211 is distanced away from the p-type body region 206 along an L direction (i.e., direction L1-L2 of FIG. 6).

As illustrated in FIG. 7 (b), when the distance X' which the p-type buried diffusion region 204 extends away from the p-type body region 206 along the W direction is fixed, extending the farther edge of the gate electrode 211 farther away from the p-type body region 206, i.e., making (X'-Y') smaller, reduces an effect of relaxing an electric field by the p-type buried diffusion region 204. This leads to concentration of an electric field (indicated as B in FIG. 10 (b)) at a bottom of the p-type buried diffusion region 204. This results in decrease in the withstanding voltage.

The n-channel LDMOS transistor of the present embodiment is so designed that the distance Y' by which the farther edge of the gate electrode 211 is distanced away from the p-type body region 206 along the W direction (i.e., direction W1-W2 of FIG. 6) is smaller than the distance Y (shown in FIG. 6) by which the farther edge of the gate electrode 211 is distanced away from the p-type body region 206 along the L direction (i.e., direction L1-L2 of FIG. 6). This allows a withstanding voltage along the W direction to be set higher than a withstanding voltage along the L direction.

Third Embodiment

Each of the first and second embodiments describes a positional relationship between the p-type buried diffusion region 204 and the gate electrode 211 of its n-channel LDMOS transistor. Since the source region includes a metal wire 213 having a fixed GND potential similarly to the gate electrode 211 when the transistor is off, a positional relationship between the p-type buried diffusion region 204 and the metal wire 213 of the source region is also important.

The following describes the positional relationship between the p-type buried diffusion region 204 and the metal wire 213 disposed above the source region, both included in an n-channel LDMOS transistor according to a third or fourth embodiment.

Figure 8:
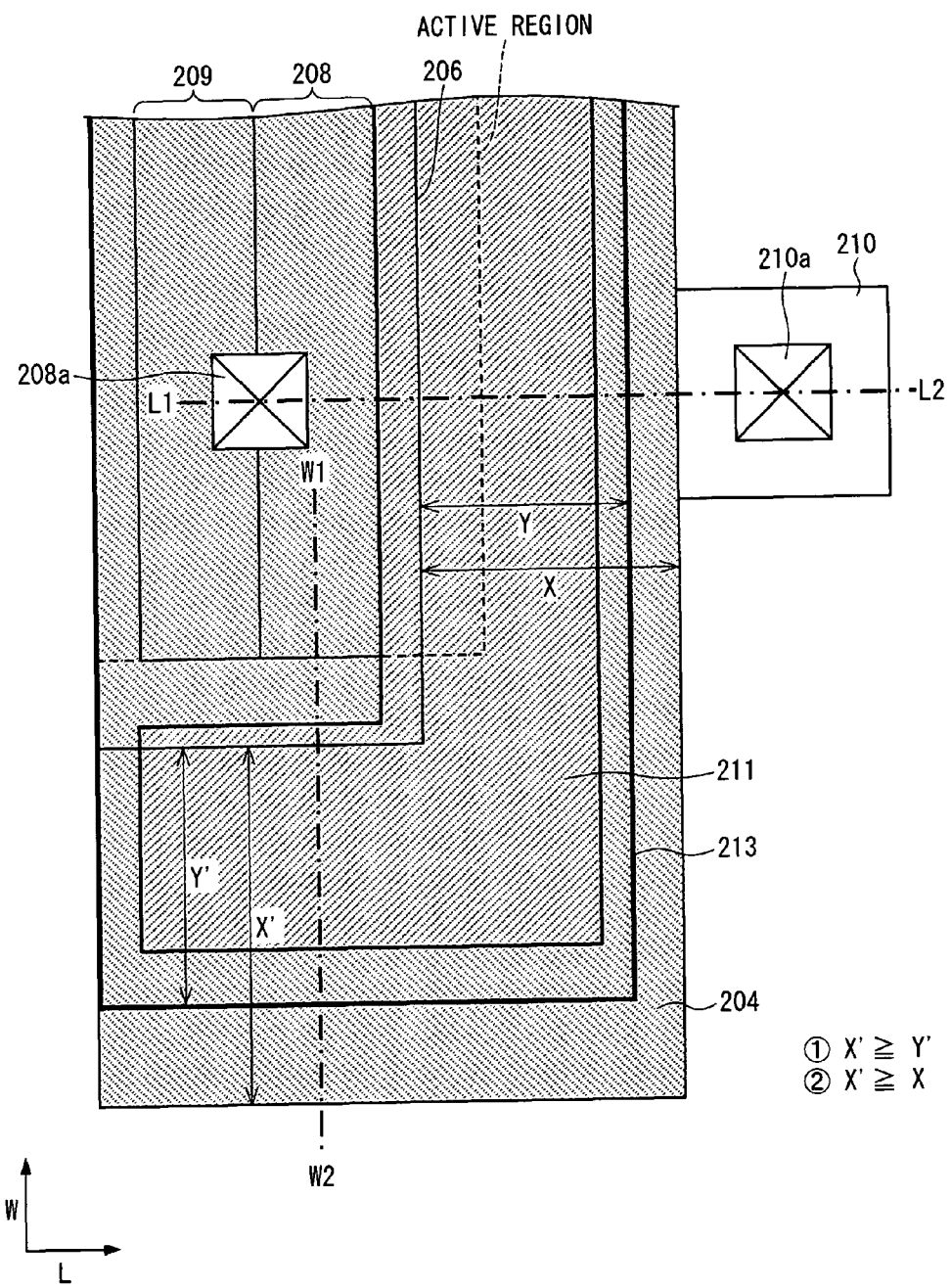
FIG. 8 is a plan view of an n-channel LDMOS transistor in accordance with a third embodiment of the present invention.
Figure 9:
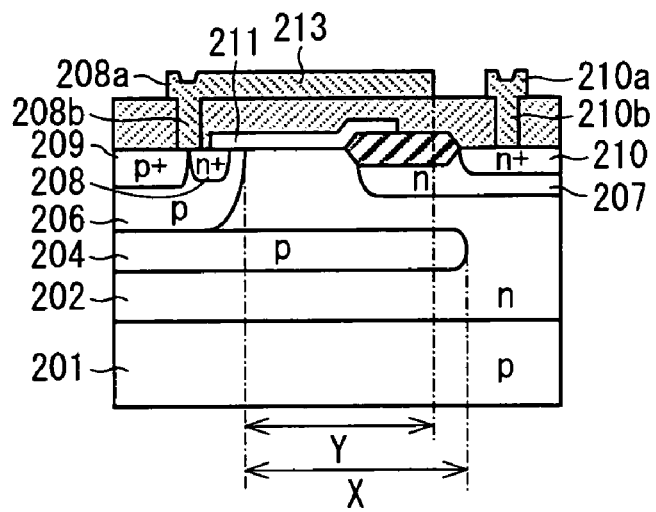
FIG. 9 (a) is a schematic cross-sectional view taken along L1-L2 of FIG. 8.
Figure 9:
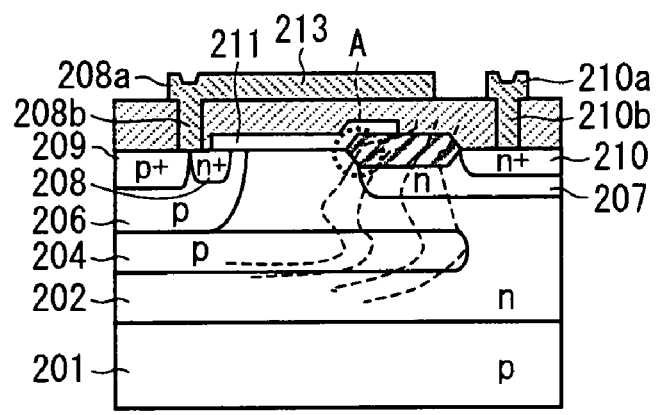
Figure 10:
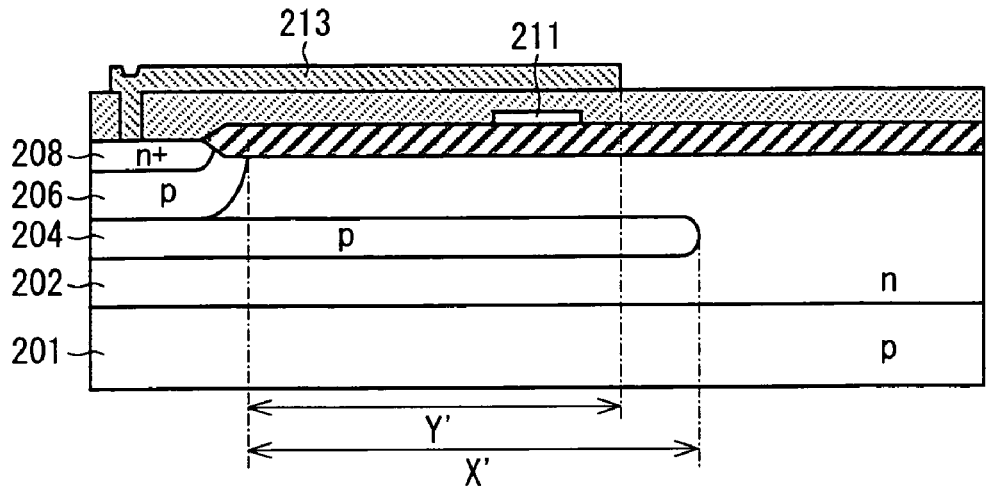
FIG. 10 (a) is a schematic cross-sectional view taken along W1-W2 of FIG. 8.
Figure 10:
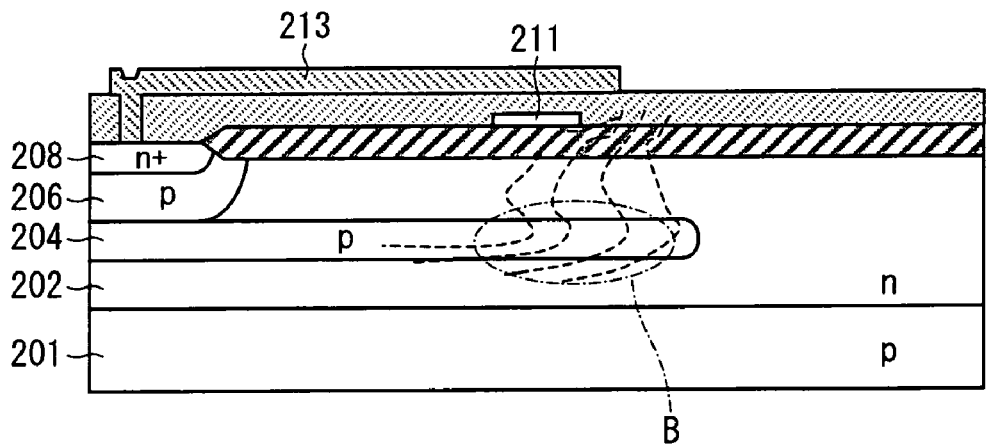

FIG. 8 is a plan view of the n-channel LDMOS transistor according to the third embodiment. FIGS. 9 (a) and 9 (b) are each a schematic cross-sectional view taken along an L direction (direction L1-L2 of FIG. 8). FIGS. 10 (a) and 10 (b) are each a schematic cross-sectional view taken along a W direction (i.e., direction W1-W2 of FIG. 8).

The n-channel LDMOS transistor of the present invention is configured such that the p-type buried diffusion region 204 provided to relax a surface electric field extends along the W direction away from the p-type body region 206 as far as or farther than the metal wire 213 of the source region is (X'≧Y'; see FIG. 10 (a)).

As illustrated in FIG. 10 (b), the p-type buried diffusion region 204 is distanced along the W direction away from the p-type body region 206 farther than the metal wire 213 of the source region. This significantly relaxes concentration of an electric field (indicated as B in FIG. 4 (c)) at a bottom of the p-type buried diffusion region 204, which concentration is a problem with conventional art.

The n-channel LDMOS transistor of the present invention is further configured such that a distance X' by which the p-type buried diffusion region 204 is distanced away from the p-type body region 206 is equal to or larger than a distance X (shown in FIG. 9 (a)) by which the p-type buried diffusion region 204 is distanced away from the p-type body region 206 along the L direction (X'≧X).

This allows a withstanding voltage along the W direction to be set higher than a withstanding voltage along the L direction. This allows the withstanding voltage of the LDMOS transistor to be determined along the L direction and therefore prevents decrease in the withstanding voltage of the LDMOS transistor, which decrease is caused by varying the withstanding voltage along the W direction.

As illustrated in FIG. 9 (b), the p-type buried diffusion region 204 sufficiently relaxes an electric field at a gate edge (indicated as A). Thus, as regards the withstanding voltage along the L direction, when a reverse bias is applied between a drain and a source, a given withstanding voltage can be attained with a higher density of the n-type drift region 207 and a relatively low on-resistance that is resulted from the higher density of the n-type drift region 207.

The occurrence of an avalanche breakdown is controlled by means of the withstanding voltage along the L direction when an overvoltage (overcurrent) such as a surge is applied to the drain region. This allows effective use of a large channel width W when, for example, a large number of the LDMOS transistors are arranged in an array. This consequently improves surge resistance significantly.

As described above, the present invention allows the LDMOS transistor to prevent decrease in the withstanding voltage along the W direction, improve the trade-off between the on-resistance and the withstanding voltage, and improve the resistance to an overvoltage (overcurrent) such as a surge.

Fourth Embodiment

Figure 11:
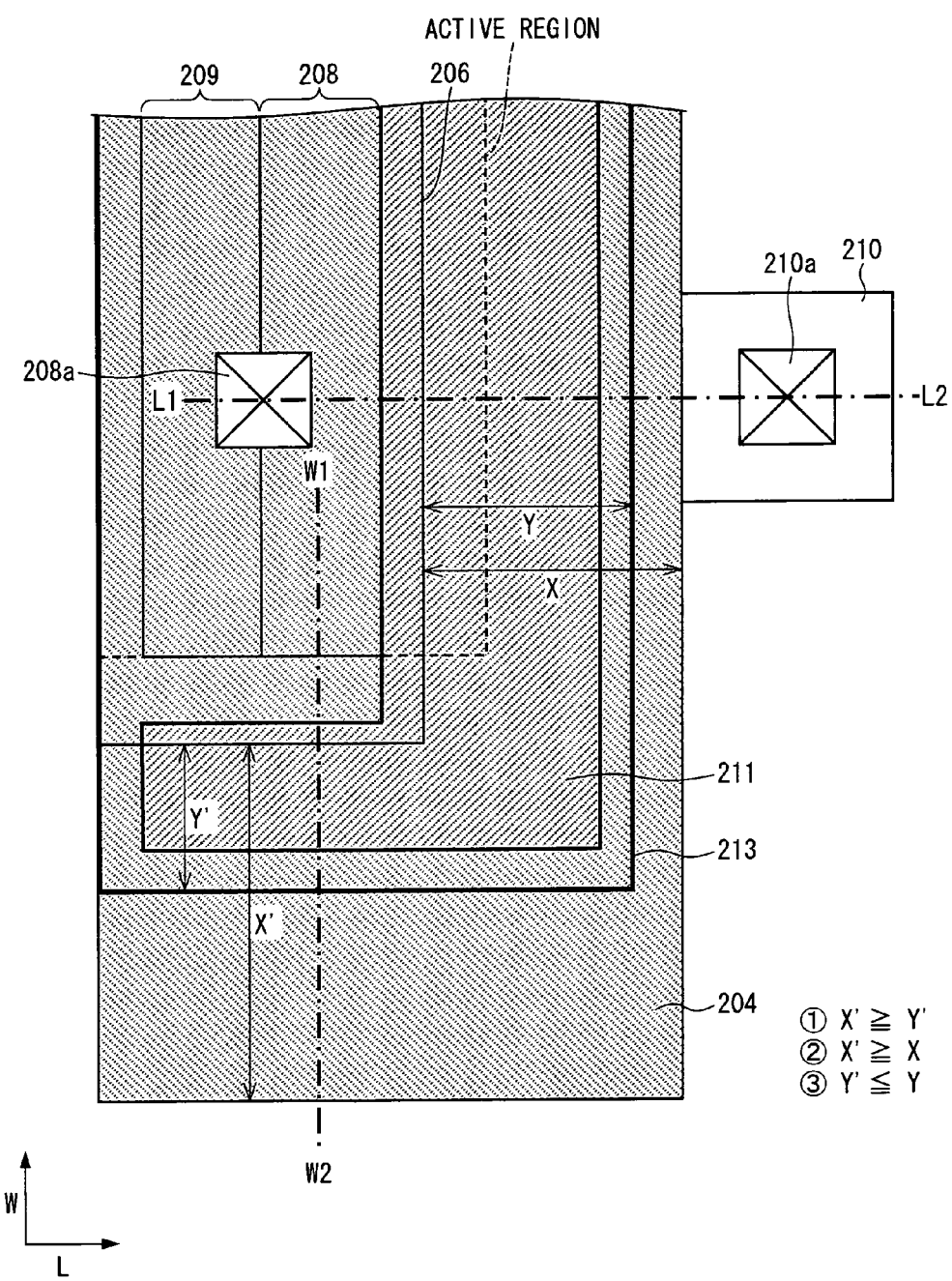
FIG. 11 is a plan view of an n-channel LDMOS transistor in accordance with a fourth embodiment of the present invention.
Figure 12:
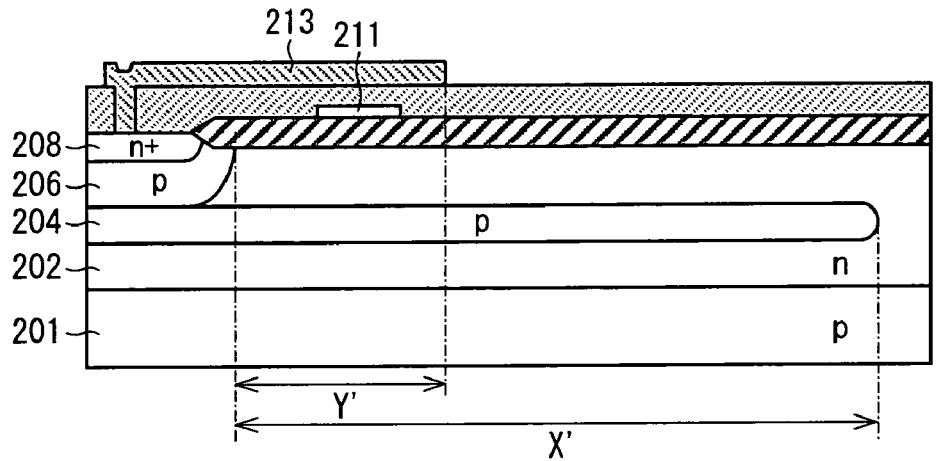
FIG. 12 (a) is a schematic cross-sectional view taken along W1-W2 of FIG. 11.
Figure 12:
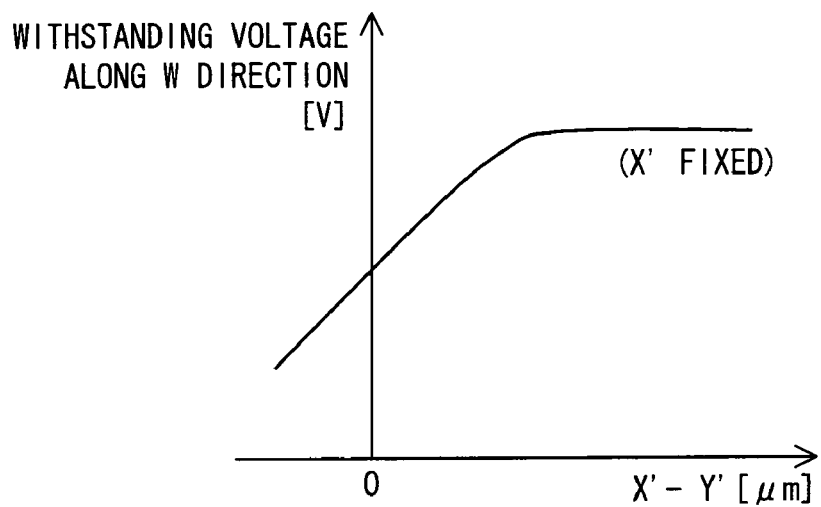

The following describes an n-channel LDMOS transistor according to the fourth embodiment with reference to the drawings. FIG. 11 is a plan view of the n-channel LDMOS transistor according to the fourth embodiment. FIG. 12 (a) is a schematic cross-sectional view taken along line W1-W2 of FIG. 11. A cross-sectional structure taken along line L1-L2 of FIG. 11 is identical to a cross-sectional structure of the n-channel LDMOS transistor according to the third embodiment (see FIG. 9 (a)). FIG. 12 (b) shows dependence of a withstanding voltage of the n-channel LDMOS transistor upon (X'-Y').

As illustrated in FIGS. 11 and 12 (a), the n-channel LDMOS transistor of the present embodiment is different from the n-channel LDMOS transistor of the third embodiment shown in FIG. 8 in that a distance Y' by which a farther edge of the metal wire 213 is distanced away from the p-type body region 206 along a W direction (i.e., direction W1-W2 of FIG. 11) is smaller than a distance Y (shown in FIG. 11) by which a farther edge of the metal wire 213 is distanced away from the p-type body region 206 along an L direction (i.e., direction L1-L2 of FIG. 11).

As illustrated in FIG. 12 (b), when a distance X' by which the p-type buried diffusion region 204 is distanced away from the p-type body region 206 along the W direction is fixed, extending the metal wire 213 of the source region farther away from the p-type body region 206, i.e., making (X'-Y') smaller, reduces an effect of relaxing an electric field by the p-type buried diffusion region 204. This leads to concentration of an electric field (indicated as B in FIG. 4 (c)) at a bottom of the p-type buried diffusion region 204. This results in decrease in the withstanding voltage.

The n-channel LDMOS transistor of the present embodiment is so designed that the distance Y' by which the farther edge of the metal wire 213 is distanced away from the p-type body region 206 along the W direction is smaller than a distance Y (shown in FIG. 11) by which the metal wire 213 of the source region is distanced away from the p-type body region 206 along the L direction (i.e., direction L1-L2 of FIG. 11). This allows the withstanding voltage along the W direction to be set higher than the withstanding voltage along the L direction.

Fifth Embodiment

With reference to the drawings, the following describes as a fifth embodiment a method of making the n-channel LDMOS transistor of each of the first and second embodiments.

FIGS. 13 (a), 13 (b), and 13 (c) are each a schematic view for illustration of the method of making the n-channel LDMOS transistor of each of the first and second embodiments of the present invention.

As illustrated in FIG. 13 (a), formation of the n-channel LDMOS transistor starts with preparation of a p-type semiconductor substrate 201. An n-type dopant is injected into the p-type semiconductor substrate 201, followed by thermal diffusion of the n-type dopant by high-temperature drive-in. This forms an n-type diffusion region 202 of a desired thickness. The n-type dopant is, for example, phosphorus. The n-type dopant is injected at, e.g., 2 MeV or more, and its dosage is $1.0 \times 10^{13}$ cm$^{-2}$ or less. The n-type dopant is injected in a region defined by, for example, placing a thick resist usable in high-energy injection over the p-type semiconductor substrate 201 and patterning the resist by photoetching or the like so that the resist has an aperture at a position corresponding to the region for the injection. Further, a LOCOS oxide film (indicated by a portion filled with oblique lines in FIGS. 13 (a), 13 (b), and 13 (c)) is formed on a portion of the front surface of the n-type diffusion region 202.

Subsequently, as illustrated in FIG. 13 (b), a p-type dopant such as boron is injected, so that a p-type body region 206 is formed. Boron is further injected at a high energy of, e.g., 1 MeV or more, so that a p-type buried diffusion region 204 is formed. During the boron injection, the p-type buried diffusion region 204 and the p-type body region 206 are defined with use of a resist mask so that the p-type buried diffusion region 204 is distanced along the W direction away from the p-type body region 206 as far as or farther than the farther edge of a later-formed gate electrode 211 is and that a distance X' by which the p-type buried diffusion region 204 is distanced from the p-type body region 206 along the W direction is equal to or larger than a distance X (shown in FIG. 13 (c)) along an L direction (X'≧Y', X'≧X). Further, the p-type buried diffusion region 204 is formed in contact with a bottom of the p-type body region 206. More specifically, the p-type buried diffusion region 204 is so formed within the n-type diffusion region 202 between the semiconductor substrate 201 and the body region 206 as to be in contact with the body region 206. Next, an n-type dopant such as phosphorus is injected at, e.g., 300 KeV or more at a position separate from the p-type body region 206, so that an n-type drift region 207 is formed. The n-type drift region 207 is formed so as to reduce on-resistance without reducing a withstanding voltage of the LDMOS transistor.

Next, a gate insulating film is formed on a front surface of the n-type diffusion region 202, and then a gate electrode 211 is formed in such a stretched shape as to overlap the p-type body region 206 and the LOCOS oxide film (see FIG. 13 (c)). It is formed by, for example, depositing a phosphorus-doped polysilicon film by CVD, forming a resist on the polysilicon film, patterning the resist by photoetching, and etching the polysilicon film by dry-etching or the like.

The gate electrode 211 of the n-channel LDMOS transistor of the first embodiment is so formed that a distance Y' by which the farther edge of the gate electrode 211 is distanced away from the p-type body region 206 along a W direction (i.e., direction W1-W2 of FIG. 1) is larger than the distance Y (shown in FIG. 1) along the L direction.

Then, phosphorus or arsenic, for example, is injected, so that an n-type source region 208 and an n-type drain region 210 are formed, while boron, for example, is injected, so that a p-type body contact region 209 is formed.

Subsequently, an oxide film (not shown) is formed superficially by, e.g., atmospheric pressure CVD for a reflow so as to reduce unevenness of a surface. The oxide film is then subjected to contact etching at respective positions above the gate electrode 211, the n-type drain region 210, the n-type source region 208, and the p-type body contact region 209, so that apertures are formed. Further, an aluminum film is grown by, e.g., sputtering, and the aluminum film is patterned by photoetching and dry-etching, so that a metal electrode is formed.

Sixth Embodiment

With reference to the drawings, the following describes as a sixth embodiment a method of making the n-channel LDMOS transistor of each of the third and fourth embodiments.

Figure 14:
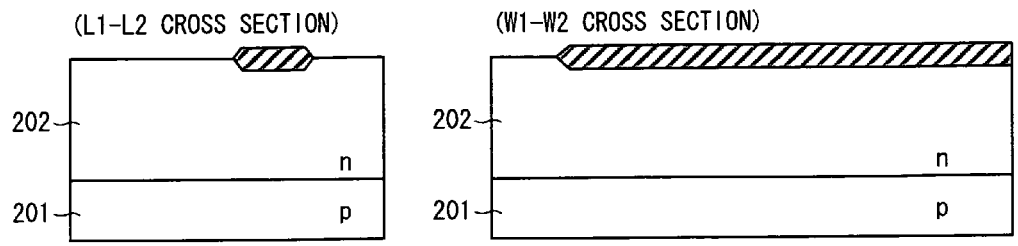
FIG. 14 (a) is a cross-sectional view illustrating, as a sixth embodiment of the present invention, a step of manufacturing the n-channel LDMOS transistor according to the third or fourth embodiment.
Figure 14:
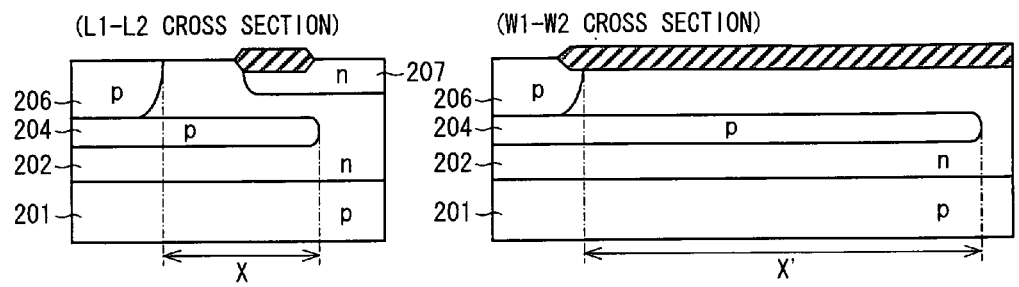
Figure 14:
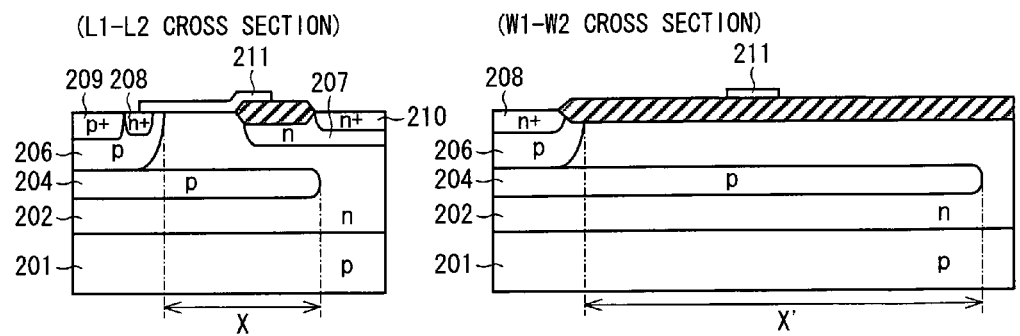
Figure 14:
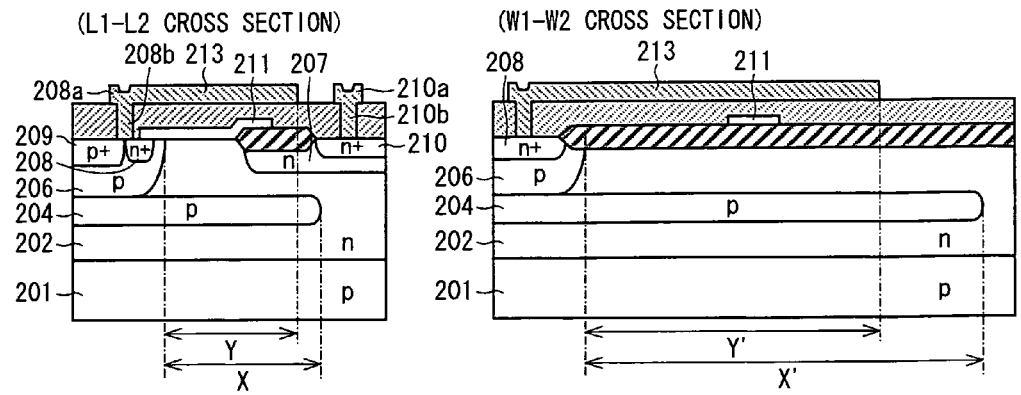
Figure 15:
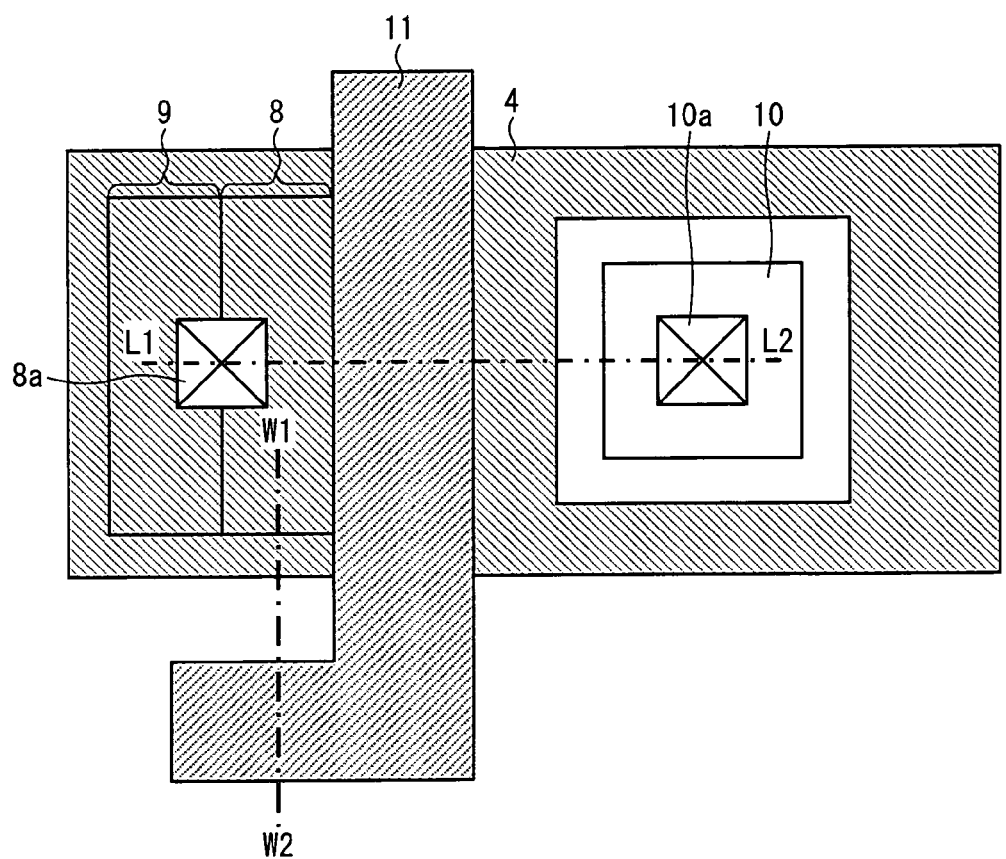
FIG. 15 is a schematic plan view of a conventional n-channel LDMOS transistor disclosed in Patent Literature 1.
Figure 16:
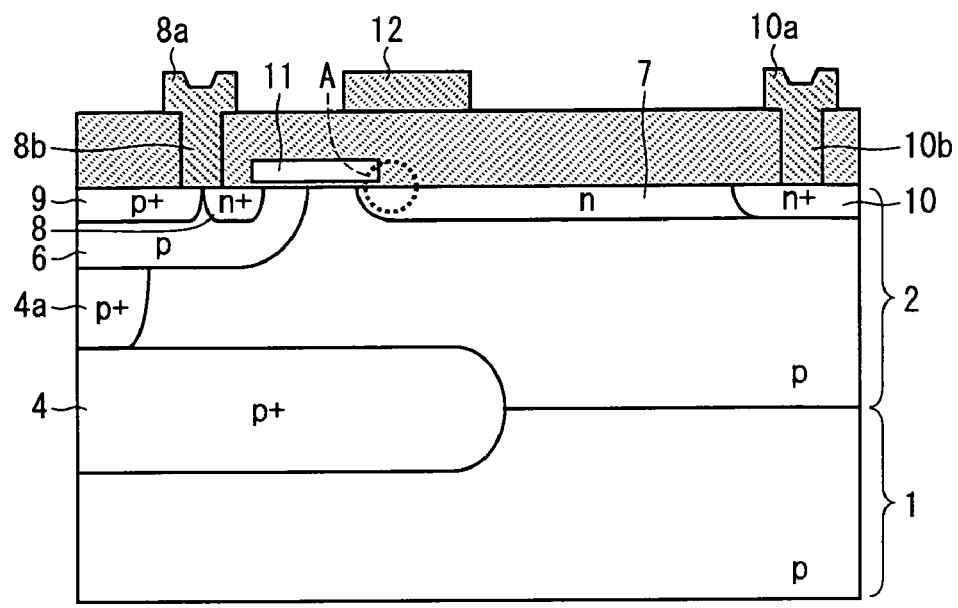
FIG. 16 (*a*) is a schematic cross-sectional view taken along L1-L2 of FIG. 15.
Figure 16:
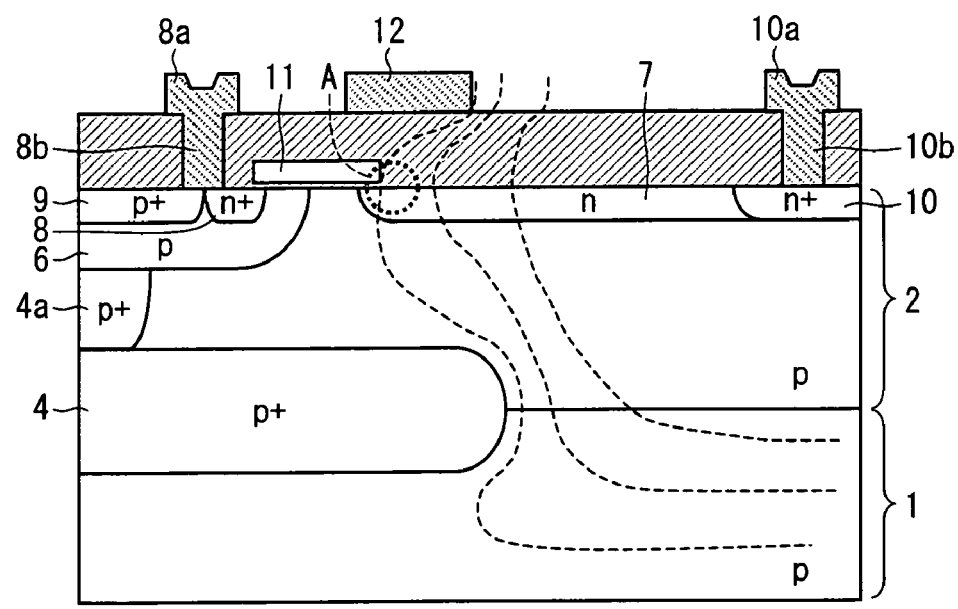
Figure 17:
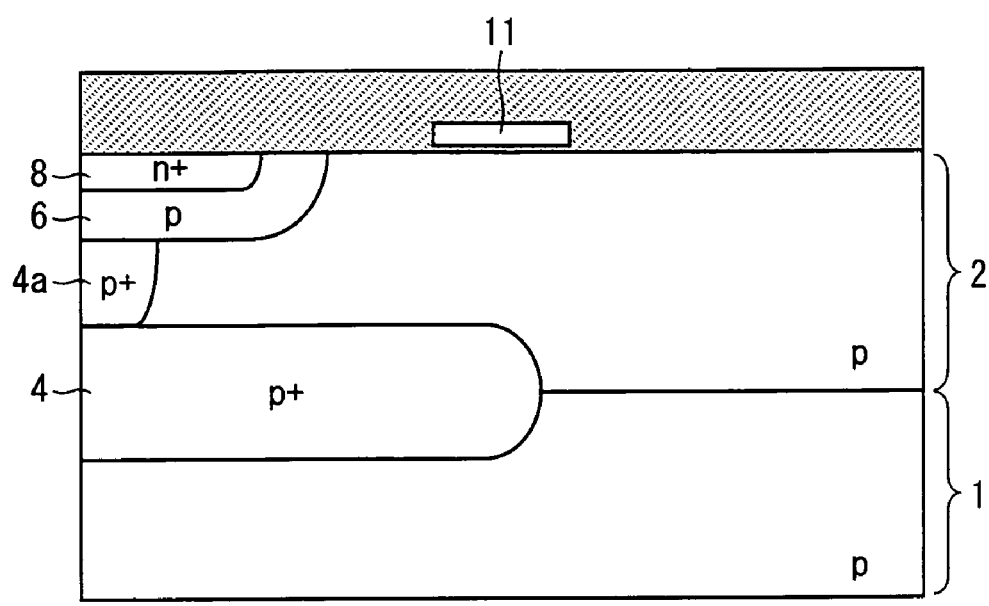
FIG. 17 is a schematic cross-sectional view taken along W1-W2 of FIG. 15.
Figure 18:
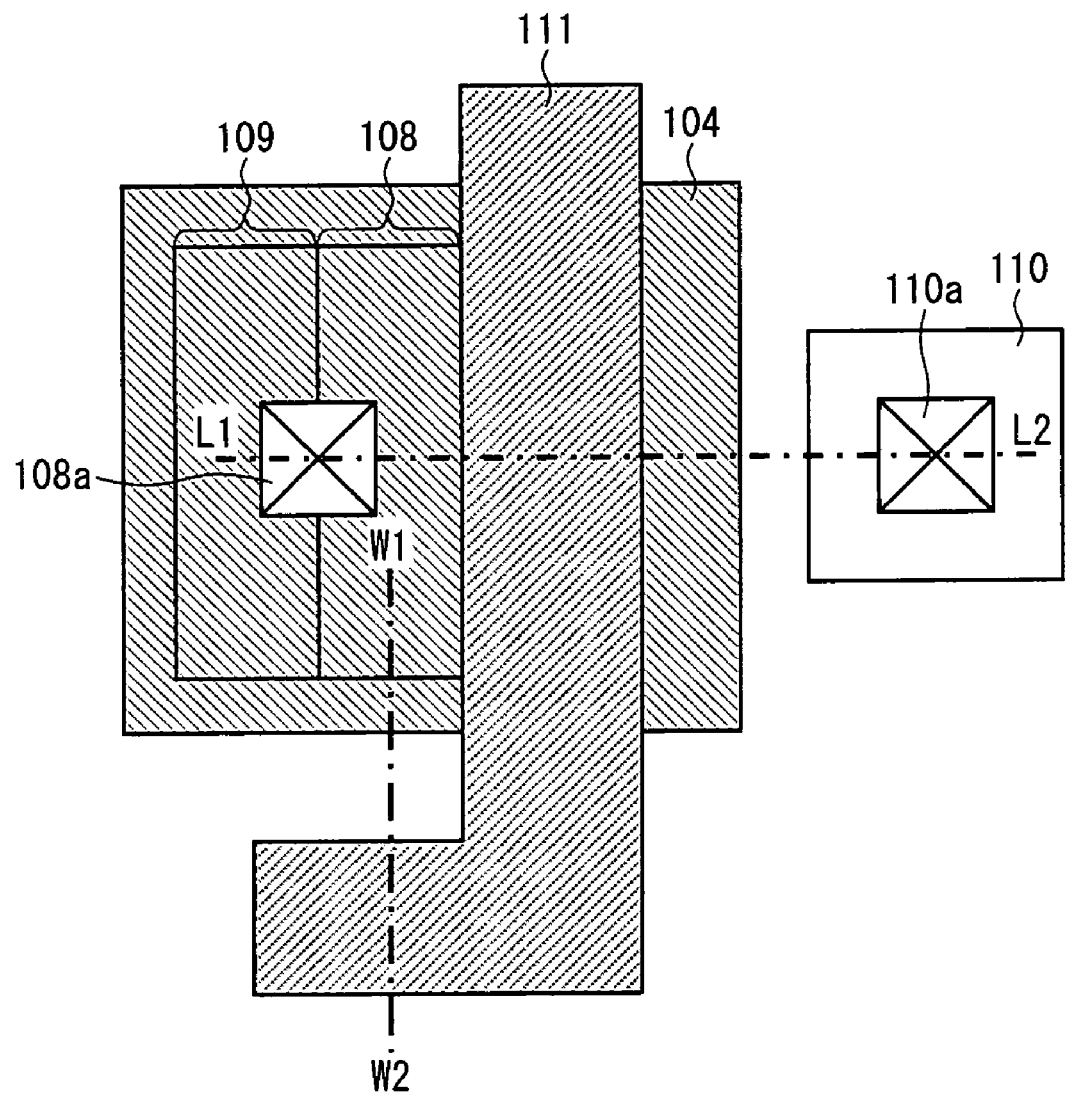
FIG. 18 is a schematic plan view of a conventional n-channel LDMOS transistor disclosed in Patent Literature 2, observed when the LDMOS transistor has gate wiring similar to gate wiring of the conventional n-channel LDMOS transistor disclosed in Patent Literature 1.
Figure 19:
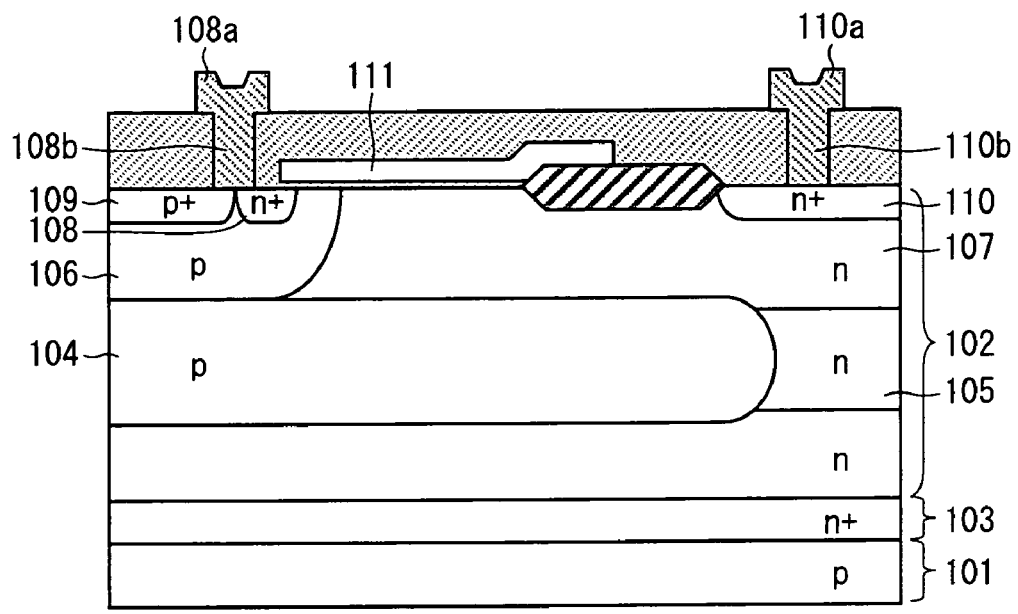
FIG. 19 (*a*) is a schematic cross-sectional view taken along L1-L2 of FIG. 18.
Figure 19:
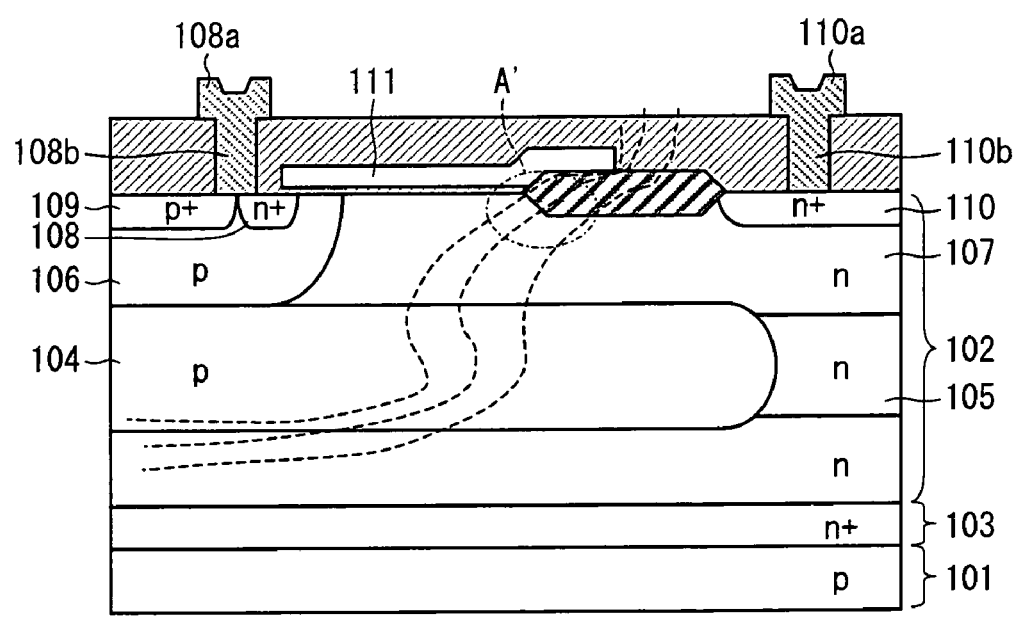
Figure 20:
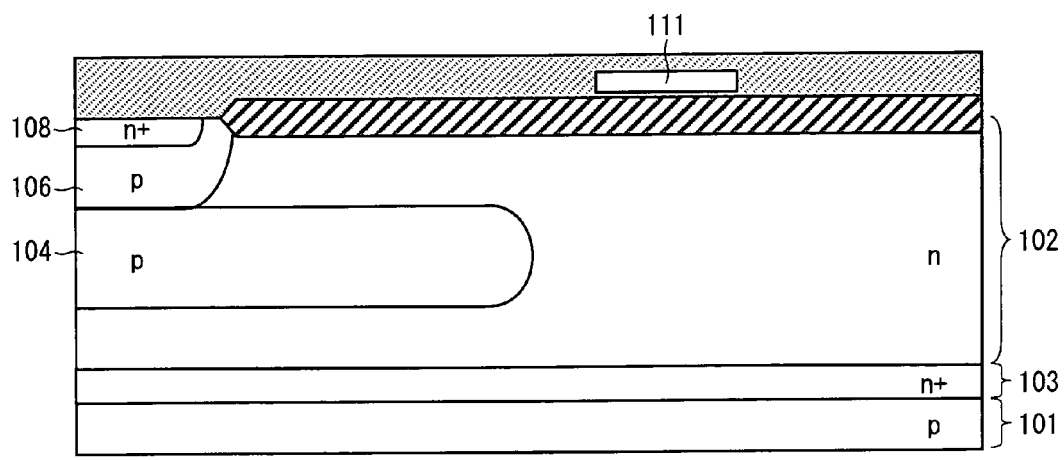
FIG. 20 (*a*) is a schematic cross-sectional view taken along W1-W2 of FIG. 18.
Figure 20:
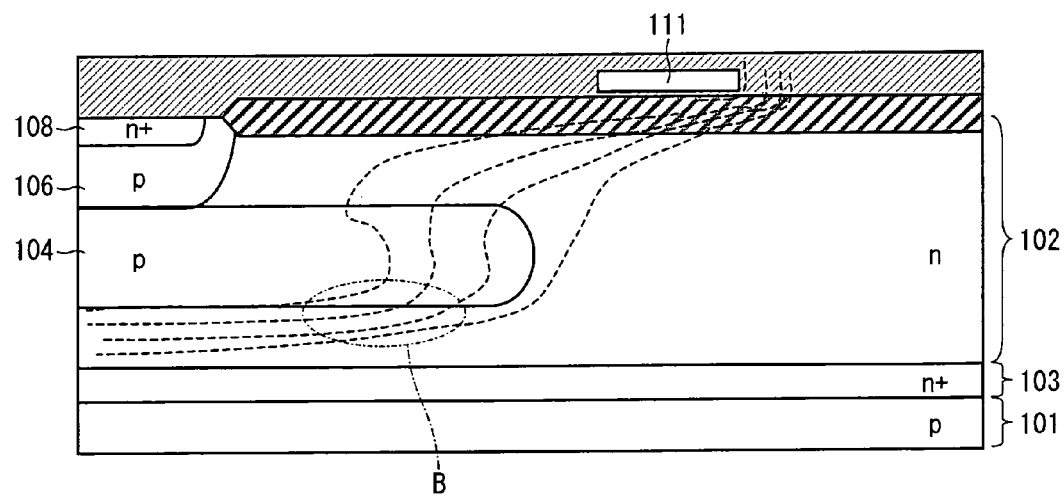

FIGS. 14 (a), 14 (b), 14 (c), and 14 (d) are each a schematic view for illustration of the method of making the n-channel LDMOS transistor of each of the third and fourth embodiments of the present invention.

FIG. 14 (a) is identical to FIG. 13 (a) of the fifth embodiment above.

As illustrated in FIG. 14 (b), a p-type dopant such as boron is injected, so that a p-type body region 206 is formed. Boron is further injected at a high energy of, e.g., 1 MeV or more, so that a p-type buried diffusion region 204 is formed. During the boron injection, the p-type buried diffusion region 204 and the p-type body region 206 are defined with use of a resist mask so that the p-type buried diffusion region 204 is distanced along a W direction away from the p-type body region 206 as far as or farther than a later-formed metal wire 213 of a source region is and that a distance X' by which the p-type buried diffusion region 204 is distanced away from the p-type body region 206 along the W direction is equal to or larger than a distance X (shown in FIG. 14 (c)) along an L direction (X'≧Y', X'≧X). Next, an n-type dopant such as phosphorus is injected at, e.g., 300 KeV or more at a position separate from the p-type body region 206, so that an n-type drift region 207 is formed. The n-type drift region 207 is formed so as to reduce on-resistance without reducing a withstanding voltage of the LDMOS transistor.

Next, a gate insulating film is formed on a front surface of the n-type diffusion region 202, and also a gate electrode 211 is formed in such a stretched shape as to overlap the p-type body region 206 and the LOCOS oxide film (see FIG. 14 (c)). The gate electrode 211 is formed by, for example, depositing a phosphorus-doped polysilicon film by CVD, forming a resist on the polysilicon film, patterning the resist by photoetching, and etching the polysilicon film by dry-etching or the like.

Then, phosphorus or arsenic, for example, is injected, so that an n-type source region 208 and an n-type drain region 210 are formed, while boron, for example, is injected, so that a p-type body contact region 209 is formed.

Subsequently, as illustrated in FIG. 14 (d), an oxide film is formed superficially by, e.g., atmospheric pressure CVD for a reflow so as to reduce unevenness of a surface. The oxide film is then subjected to contact etching at respective positions above the gate electrode 211, the n-type drain region 210, the n-type source region 208, and the p-type body contact region 209, so that apertures are formed. Further, an aluminum film is grown by, e.g., sputtering, and the aluminum film is patterned by photoetching and dry-etching, so that a source electrode 208a, a drain electrode 210a, and a metal wire 213 are formed. The metal wire 213 may be formed simultaneously with or after formation of the source electrode 208a and the drain electrode 210a.

The metal wire 213 of the source region of the n-channel LDMOS transistor according to the fourth embodiment is so formed that a distance Y' by which the metal wire 213 of the source region is distanced away from the p-type body region 206 along the W direction (i.e., direction W1-W2 of FIG. 11) is smaller than the distance Y (shown in FIG. 14 (d)) along the L direction.

The semiconductor device of each of the above embodiments may preferably be arranged such that a distance in which the buried diffusion region extends away from the body region along the cross section perpendicular to the source-drain direction is larger than a distance in which the buried diffusion region extends away from the body region along a cross section parallel to the source-drain direction This allows the semiconductor device of each of the above embodiments to have a withstanding voltage along the direction perpendicular to the source-drain direction, which withstanding voltage is higher than the withstanding voltage along the source-drain direction. This causes the withstanding voltage of the semiconductor device to be determined along the source-drain direction. While application of an overvoltage (overcurrent) such as a surge to the drain region causes an avalanche breakdown dominantly along the direction perpendicular to the source-drain direction, effective use of a large channel width improves surge resistance. In particular, the large channel width can be effectively used when a large number of the semiconductor devices of any of the above embodiments are arranged in an array.

The semiconductor device of each of the above embodiments may preferably be arranged such a distance in which a farther edge of the gate electrode is distanced away from the body region along the cross section perpendicular to the source-drain direction is smaller than a distance in which a farther edge of the gate electrode is distanced away from the body region along a cross section parallel to the source-drain direction.

This prevents concentration of an electric field at the gate edge on the drain side for further improvement in the withstanding voltage of the semiconductor device, improves the trade-off between the on-resistance and the withstanding voltage, and also improves the resistance to an overvoltage (overcurrent) such as a surge.

The semiconductor device of each of the above embodiments may preferably be arranged such that the conductive region of the second conductive type (the n-type diffusion region 202) is formed with either a diffusion region or an epitaxial layer.

This allows the second conductive region to be formed with a diffusion region or an epitaxial layer on a case-by-case basis.

INDUSTRIAL APPLICABILITY

The present invention is applicable to semiconductor devices and methods for making the same and, in particular, to devices such as switching regulators, various drivers, and DC-DC converters, in the fields of power devices and high-withstanding-voltage devices.

REFERENCE SIGNS LIST 1, 101, 201 p-type semiconductor substrate (semiconductor substrate of a first conductive type)
2 p-type epitaxial layer
102 n-type epitaxial layer
202 n-type diffusion region (conductive region of a second conductive type)
103 n-type high-density buried diffusion layer
4, 104, 204 p-type buried diffusion region (buried diffusion region of the first conductive type)
4a p-type diffusion region
105 n-type diffusion region
6, 106, 206 p-type body region (body region of the first conductive type)
7, 107, 207 n-type drift region (drift region of the second conductive type)
8, 108, 208 n-type source region (source region of the second conductive type)
8a, 108a, 208a source electrode
8b, 108b, 208b source contact
10, 110, 210 n-type drain region (drain region of the second conductive type)
10a, 110a, 210a drain electrode
10b, 110b, 210b drain contact
11, 111, 211 gate electrode
12 gate plate
213 metal wire of the source region

The invention claimed is:

1. A semiconductor device comprising:
a semiconductor substrate of a first conductive type;
a conductive region of a second conductive type above the semiconductor substrate;
a body region of the first conductive type within the conductive region of the second conductive type;
a buried diffusion region of the first conductive type within the conductive region of the second conductive type, the buried diffusion region being provided between the semiconductor substrate and the body region and in contact with the body region;
a source region of the second conductive type and a body contact region of the first conductive type within the body region;
a drift region of the second conductive type within the conductive region of the second conductive type, the drift region of the second conductive type being provided separately from the body region;
a drain region of the second conductive type within the drift region; and
a gate electrode above the body region,
the buried diffusion region of the first conductive type extending away from the body region farther than the gate electrode is, along a cross section perpendicular to a source-drain direction.

2. The semiconductor device according to claim 1, wherein a distance in which the buried diffusion region of the first conductive type extends away from the body region along the cross section perpendicular to the source-drain direction is larger than a distance in which the buried diffusion region of the first conductive type extends away from the body region along a cross section parallel to the source-drain direction.

3. The semiconductor device according to claim 1, wherein a distance in which a farther edge of the gate electrode is distanced away from the body region along the cross section perpendicular to the source-drain direction is smaller than a distance in which a farther edge of the gate electrode is distanced away from the body region along a cross section parallel to the source-drain direction.

4. The semiconductor device according to claim 1, wherein the conductive region of the second conductive type is formed with either a diffusion region or an epitaxial layer.

* * * * *